(12) United States Patent
Akasaka et al.

(10) Patent No.: US 9,341,513 B2
(45) Date of Patent: May 17, 2016

(54) PHOTODETECTING ELEMENT HAVING AN OPTICAL ABSORPTION LAYER, PHOTODETECTING DEVICE HAVING AN OPTICAL ABSORPTION LAYER, AND AUTO LIGHTING DEVICE

(75) Inventors: Shunsuke Akasaka, Kyoto (JP); Tetsuo Fujii, Kyoto (JP); Koki Sakamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 865 days.

(21) Appl. No.: 13/570,233

(22) Filed: Aug. 8, 2012

(65) Prior Publication Data

US 2013/0038209 A1     Feb. 14, 2013

(30) Foreign Application Priority Data

Aug. 9, 2011 (JP) ............................... P2011-173875
May 31, 2012 (JP) ............................... P2012-124258

(51) Int. Cl.

| H01L 31/0232 | (2014.01) |
|---|---|
| G01J 1/42 | (2006.01) |
| G01J 1/04 | (2006.01) |
| H01L 31/0203 | (2014.01) |
| H01L 31/0224 | (2006.01) |
| H01L 31/09 | (2006.01) |

(52) U.S. Cl.
CPC .............. *G01J 1/4204* (2013.01); *G01J 1/0488* (2013.01); *G01J 1/429* (2013.01); *H01L 31/0203* (2013.01); *H01L 31/0224* (2013.01); *H01L 31/09* (2013.01)

(58) Field of Classification Search
CPC ... H01L 31/0224; H01L 31/09; H01L 31/101; H01L 31/1884
USPC ........ 250/214.1, 214 LA, 214 A, 214 R, 205, 250/239; 257/290–292
See application file for complete search history.

(56) References Cited

U.S. PATENT DOCUMENTS 8,212,201 B2 * 7/2012 Murata ....................... 250/214.1

FOREIGN PATENT DOCUMENTS

| JP | 2009-070950 A | 4/2009 |
|---|---|---|
| JP | 2010-276483 A | 12/2010 |
| JP | 2011-151269 A | 8/2011 |

* cited by examiner

*Primary Examiner* — Que T Le
(74) *Attorney, Agent, or Firm* — Rabin & Berdo, P.C.

(57) ABSTRACT

To provide both a photodetecting element and a photodetecting device which can prevent generating of a plurality of current paths, and can detect with stability and high sensitivity regardless of a surface state instability of an optical absorption layer. The photodetecting element includes an optically transparent substrate, an optical absorption layer, an electrode, an electrode, an adhesive layer, an insulating film, and a package. The optical absorption layer is formed on the optically transparent substrate, and a part of each the electrodes is embedded in the optical absorption layer. The photodetecting unit is bonded junction down with the adhesive layer on the package. The optical absorption layer absorbs light of a specified wavelength selectively to be converted into an electric signal. The light to be measured is irradiated from a back side surface of the optically transparent substrate.

20 Claims, 19 Drawing Sheets

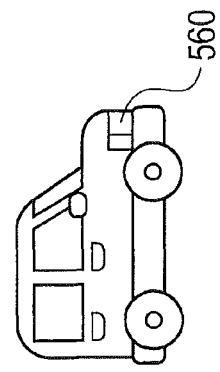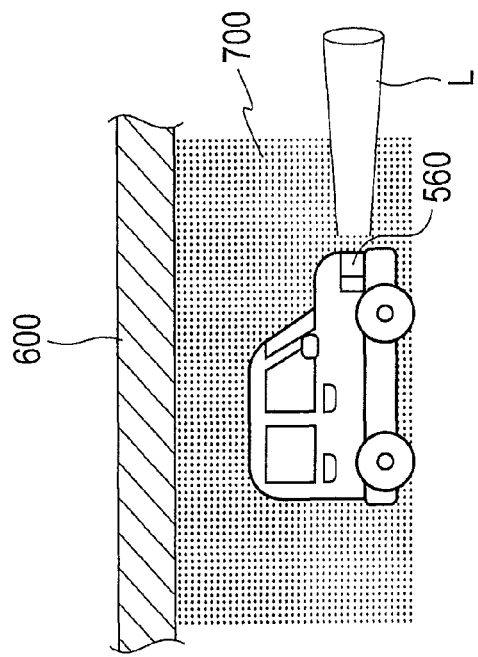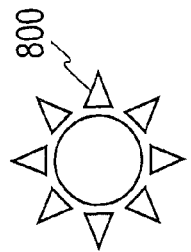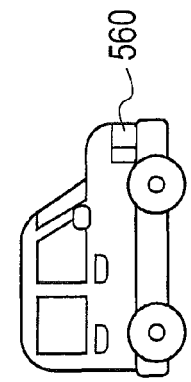
FIG. 27A  FIG. 27B  FIG. 27C

US 9,341,513 B2

PHOTODETECTING ELEMENT HAVING AN OPTICAL ABSORPTION LAYER, PHOTODETECTING DEVICE HAVING AN OPTICAL ABSORPTION LAYER, AND AUTO LIGHTING DEVICE

CROSS REFERENCE TO RELATED APPLICATIONS AND INCORPORATION BY REFERENCE

This application is based upon and claims the benefits of priority from prior Japanese Patent Application No. P2011-173875 filed on Aug. 9, 2011 and Japanese Patent Application No. P2012-124258 filed on May 31, 2012, the entire contents of which are incorporated herein by reference.

TECHNICAL FIELD

The present invention relates to a photodetecting element, a photodetecting device, and an auto lighting device each which suppresses an influence caused by a surface state instability of an optical absorption layer to detect light stably.

BACKGROUND ART

For example, there is a photodetecting device using the so-called photoconductive type sensor element which detects ultraviolet light irradiated to alight detecting unit by change of an amount of optically induced current of the light detecting unit.

As the photoconductive type sensor element, a silicon semiconductor etc. which have detection sensitivity in visible light etc. in a wavelength range from 400 to 750 nm are conventionally supposed.

A photodetecting principle of such as photoconductive type sensor element is to generate an electron-hole pair in a semiconductor by a photoelectric-conversion operation by irradiating with light which has an energy equal to or greater than the semiconductor bandgap of the light detecting unit, and to extract the above carrier to an external circuit by an externally-applied voltage to be detected as an amount of optically induced current.

The ZnO-based ultraviolet light sensor is also proposed.

It is known that metal oxide surface resistivity is subject to operational environment including oxygen concentration and humidity. Therefore a semiconductor type gas sensor usually makes use of the above phenomenon mentioned above.

ZnO semiconductor surface resistivity is also subject to operational environment including oxygen concentration, moisture and an organic molecule.

Accordingly, the applicant proposed an ultraviolet light detecting element described in Patent Literature 1.

The ultraviolet light detecting element mentioned above uses an embedded type electrode in order to suppress an influence of electrically unstable film surface as much as possible and to control a variation in electrical characteristics for each element.

CITATION LIST

Patent Literature 1: Japanese Patent Application Laying-Open Publication No. 2010-276483

SUMMARY OF THE INVENTION

Technical Problem

Surely in a structure described in Patent Literature 1, there is an effect extremely in preventing change of contact resistance etc. However, a surface layer of substances, e.g. a semiconductor layer, generally has an unstable value of resistance. For example, a surface state may change during a manufacturing process. A surface layer of an oxide semiconductor has lower resistance compared with other regions due to oxygen vacancies at the surface layer. A surface electrical resistance of semiconductors except the oxide also changes with its surface state. If the surface state changes due to adhesion of dirt or an impurity etc., the surface resistance thereof will change and will unstable.

Accordingly, even when a configuration including an embedded type electrode is adopted as described in Patent Literature 1, since two current paths over which a current flows approximately linearly between electrodes, and a current flows from one electrode to another electrode via a surface layer is generated, and irradiated light is detected by using both of the currents, there is a problem that electrical characteristics and sensitivity of the photodetecting element are unstable.

In the ultraviolet light detecting element described in Patent Literature 1, some passivation films are formed on a surface of an ultraviolet light absorption layer in order to prevent an influence of moisture, an organic molecule, etc. in operational environment. However, there was a problem that some passivation films has a so high absorption coefficient in some ultraviolet light region that sensitivity of the ultraviolet light detecting element is degraded.

On the other hand, since the influence of ultraviolet light on a human body is different depending on wavelengths, not only intensity of the ultraviolet light but also the wavelength should be taken into consideration with respect to the influence given on the human body.

Here, the CIE operational spectrum is defined by the Commission Internationale de L'Eclairage (CIE) as a relative influence rate to a human body for each wavelength.

UV index is a value which is integrated with an equation (sunlight spectrum)×(CIE operational spectrum)=(amount of dosage of the CIE ultraviolet light irradiation) (mW/m$^2$) and divided by 25, and is used as an index of dangerousness of the ultraviolet light.

However, in order to measure the UV index exactly, there was a problem that a sunlight spectrum is needed to be measured using a spectroscope, thereby needing time and effort.

Moreover, although a sensor for measuring UV-B has been developed, there was also a problem that the price thereof is so expensive as several hundreds of thousands yen, and a size thereof is so large, thereby such a sensor is unsuitable in spread in general consumers.

There is a request for utilizing a detected result of the ultraviolet light with respect to an auto lighting device which turns ON and OFF automatically based on illuminance.

The present invention is achieved to solve the problems mentioned above, and the object of the present invention is to provide both a photodetecting element and a photodetecting device which can prevent generating of a plurality of current paths, and can detect with stability and high sensitivity regardless of a surface state of an optical absorption layer.

Another object of the present invention is to provide a photodetecting device which can measure a UV index roughly and rapidly.

Still another object of the present invention is to provide an auto lighting device which utilizes a detected result of ultraviolet light by a photodetecting device to improve convenience.

Solution to Problem

According to an aspect of the present invention, there is provided a photodetecting element comprising: an optically transparent substrate; an optical absorption layer formed on the optically transparent substrate; a detecting electrode formed on the optically transparent substrate; and an insulating film formed so that a surface of the optical absorption layer is covered, wherein at least a part of the detecting electrode is embedded in the optical absorption layer, the light is radiated from the optically transparent substrate side, and the detecting electrode detects current generated from the optical absorption layer.

According to another aspect of the present invention, there is provided a photodetecting device comprising a plurality of photodetecting element, each the photodetecting element comprising: an optically transparent substrate; an optical absorption layer formed on the optically transparent substrate; a detecting electrode formed on the optically transparent substrate; and an insulating film formed so that a surface of the optical absorption layer is covered, wherein at least a part of the detecting electrode is embedded in the optical absorption layer, the light is radiated from the optically transparent substrate side, and the detecting electrode detects current generated from the optical absorption layer. The plurality of the photodetecting element comprises a first photodetecting element and a second photodetecting element, wherein the first photodetecting element comprises a first optical filter formed on a surface of light incidence side. The first optical filter is configured to absorb light of a certain wavelength range λ. The second photodetecting element comprises a second optical filter formed on a surface of light incidence side on the second optically transparent substrate. The second optical filter is configured to have less optical absorption in the wavelength range λ than the first optical filter, and an amount of the light of the wavelength range λ is measured by calculating signal from the first photodetecting element and a signal from the second photodetecting element.

According to still another aspect of the present invention, there is provided an auto lighting device comprising: a lighting device; a photodetecting device configured to detect external ultraviolet light; an illuminance detecting device configured to detect external illuminance; and a control device configured to turn ON and turn OFF the lighting device based on a result detected by the photodetecting device and the illuminance detecting device.

Advantageous Effects of Invention

According to the present invention, there is provided both a photodetecting element and a photodetecting device which can prevent generating of a plurality of current paths, and can detect with stability and high sensitivity regardless of a surface state instability of an optical absorption layer.

Moreover, according to the present invention, there is provided a photodetecting device which can measure a UV index roughly and rapidly.

Moreover, according to the present invention, there is provided an auto lighting device which utilizes a detected result of ultraviolet light by a photodetecting device to improve convenience.

BRIEF DESCRIPTION OF DRAWINGS

FIG. 27A is an explanatory diagram showing an operation situation in the case of mounting the auto lighting device according to the third embodiment in automobile to be functioned as only an illuminance sensor, and is a schematic diagram corresponding to the case of traveling under an environment where sunlight including ultraviolet light is shined from the sun 800.

FIG. 27B is an explanatory diagram showing an operation situation in the case of mounting the auto lighting device according to the third embodiment in automobile to be functioned as only the illuminance sensor, and is a schematic diagram corresponding to the case where it travels for a comparatively short distance of shady areas 700, e.g. under an elevated bridge 600.

FIG. 27C is an explanatory diagram showing an operation situation in the case of mounting the auto lighting device according to the third embodiment in automobile to be functioned as only the illuminance sensor, and is a schematic diagram corresponding to the case where an automotive headlight 560 is turned OFF state again after passing under the elevated bridge 600 etc.

DESCRIPTION OF EMBODIMENTS

Figure 1:
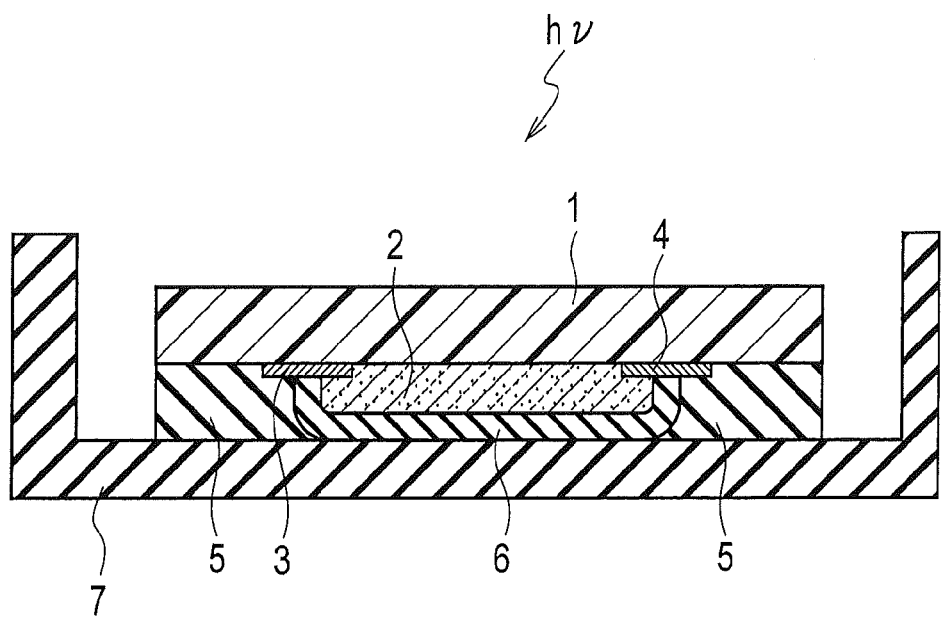
FIG. 1 is a schematic cross-sectional structure diagram showing a configuration example of a photodetecting element according to a first embodiment.

Next, embodiments of the invention will be described with reference to drawings. In the description of the following drawings, the identical or similar reference numeral is attached to the identical or similar part. However, it should be known about that the drawings are schematic and the relation between thickness and the plane size and the ratio of the thickness of each layer differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea of the present invention; and the embodiments of the present invention does not specify the material, shape, structure, placement, etc. of component parts as the following. Various changes can be added to the technical idea of the present invention in scope of claims.

The term "transparence" is defined as a state where a transmission rate is not less than about 50% in a photodetecting element, a photodetecting device, and an auto lighting device according to the following embodiments of the present invention. Moreover, the term "transparence" is also used for a purpose of meaning "transparent and colorless with respect to visible light" in the photodetecting element, the photodetecting device, and the auto lighting device according to the following embodiments of the present invention. The visible light is equivalent to light having a wavelength of approximately 360 nm to approximately 830 nm and energy of approximately 3.4 eV to approximately 1.5 eV, and it can be said that it is transparent if the transmission rate is not less than 50% in such a region.

First Embodiment (Photodetecting Device)

A schematic cross-sectional structure showing a configuration example of a photodetecting element according to a first embodiment is represented as shown in FIG. 1. A photodetecting unit is composed of an optically transparent substrate 1, an optical absorption layer 2, an electrode 3, an electrode 4, an adhesive layer 5, and an insulating film 6. The optical absorption layer 2 is formed on the optically transparent substrate 1, and the optical absorption layer 2 is formed so that a part of each the electrode 3 and 4 is covered. When the electrode 3 is a positive electrode, the electrode 4 is equivalent to a negative electrode, and when the electrode 3 is a negative electrode, the electrode 4 is equivalent to a positive electrode. The photodetecting unit is die-bonded junction down (face down) with the adhesive layer 5 on a package 7 composed of an insulating film.

The optical absorption layer 2 is composed of substances which absorb light of a specified wavelength selectively and generate an electron and a hole (e.g., a semiconductor layer etc. having a photoelectric effect). In this case, the electrodes 3 and 4 are formed on the optically transparent substrate 1, and a part of each the electrode 3 and 4 are embedded in the optical absorption layer 2. Alternatively, a whole of the electrodes 3 and 4 may be embedded in the optical absorption layer 2. A surface (an opposite side in direction to the optically transparent substrate 1) and a side surface of the optical absorption layer 2 are covered completely with the insulating film 6, and both ends of the insulating film 6 are formed on the electrode 3 and 4. Since the adhesive layer 5 is formed at both sides of the insulating film 6, and the optically transparent substrate 1 and a bottom surface of the package 7 is bonded with the adhesive layer 5, the whole of the photodetecting unit is fixed on the package 7.

Moreover, a shape of the package 7 is formed to be U-shaped. A height of a side surface of a package 7 surpasses a height of a back side surface of the optically transparent substrate 1 of the photodetecting unit, and the side surface of the package 7 is formed so as to surround completely the whole of the photodetecting unit. The side surface of the package 7 is formed so as to reach at least the height of the back side surface of the optically transparent substrate 1 of the photodetecting unit.

The electrodes 3 and 4 are electrodes for extracting to the outside a current based on an electron and a hole generated from light absorbed by the optical absorption layer 2. Accordingly, although it is necessary to apply a bias of a direct current between the electrode 3 and the electrode 4, and therefore a DC power supply (not shown) is connected thereto. It is composed so that the bias voltage may be changed.

As for the optical absorption layer 2, it is preferable to use materials being of high resistance and absorbs selectively only a specified wavelength region. A reason for being preferable to be high resistance is because it is necessary to make a distinction between a carrier generated by the light and a current generated by the bias applied to the element.

On the other hand, as the optically transparent substrate 1, it is preferable to use transparent materials having the high resistance which does not cause absorption with respect to at least light of a wavelength region to be detected, and h is not made to generate needless current, and therefore glass, a sapphire substrate, etc. can be used, for example. As the insulating film 6 and the package 7, materials excellent in water proof, moisture proof, a scratch-resistant function, etc. (e.g., SiN or $SiO_2$ etc.) can be used. Generally, SiN excellent in waterproof is often used. Moreover, the package 7 may be a supporting base. In this case, as the package 7, a supporting base in which a metal wiring pattern is formed is used on the assumption that the package 7 is disposed in a housing etc.

For example, when detecting ultraviolet light in the structure described in Patent Literature 1, since SiN which absorbs ultraviolet light leads to degrade of sensitivity of the photodetecting element, it is not preferable to use SiN. However, since the photodetecting element according to the first embodiment is not the structure where the insulating film 6 and the package 7 are disposed up to the point where light reaches the optical absorption layer 2 as shown in FIG. 1, materials of the insulating film can be selected without being careful with regard to absorption of ultraviolet light.

Light is irradiated from a back side surface side of the optically transparent substrate 1 as the arrow shown in FIG. 1. The light which passes through the optically transparent substrate 1 is absorbed by the optical absorption layer 2, a hole and an electron are generated by a photoelectric effect, and thereby the light is detected as a current which flows between the electrode 3 and the electrode 4.

In the photodetecting element according to the first embodiment, the electrodes 3 and 4 are not embedded into the optical absorption layer 2, but are formed on the optical absorption layer 2, and the photodetecting unit is bonded junction down to the package 7 by using flip chip bonding so that the electrodes and the optical absorption layer are not exposed to operational environment. Accordingly, degradation of the electrodes and the optical absorption layer can be prevented. Further, an influence caused by an electrical conduction of the surface layer of the optical absorption layer can be eliminated by adopting the structure where the light is irradiated from the back side surface of the optically transparent substrate 1. Accordingly, electrical characteristics of the photodetecting element are stability, and therefore photodetection with high sensitivity can be executed stability.

Figure 2:
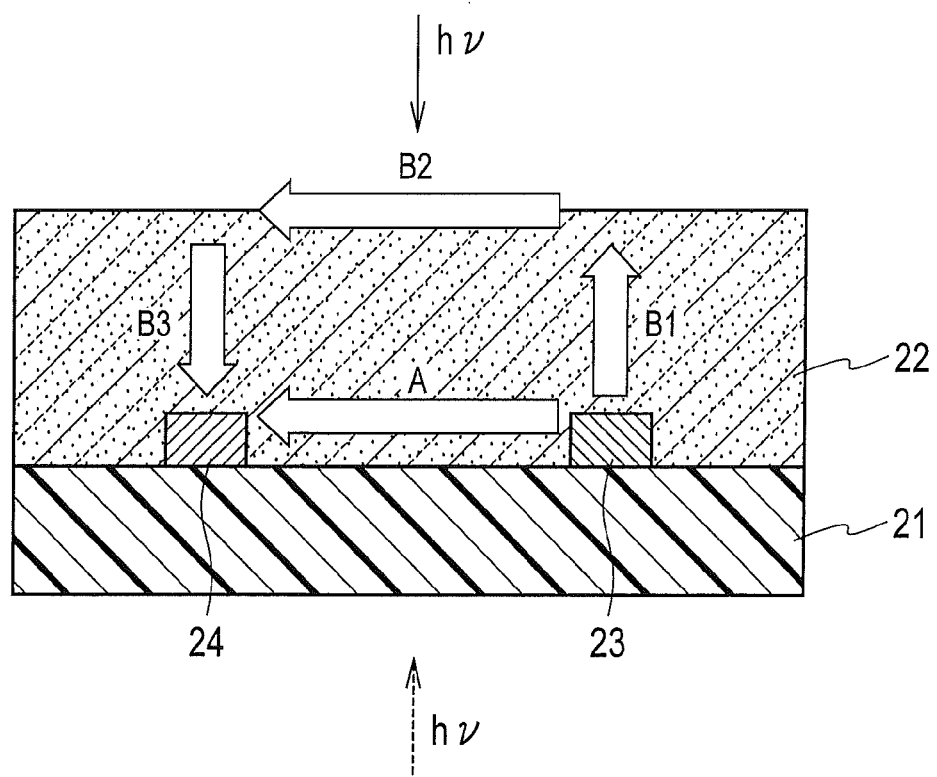
FIG. 2 is an explanatory diagram showing a plurality of current paths generated in a photodetecting element using an embedded type electrode, in the photodetecting element according to the first embodiment.

An explanatory diagram showing a plurality of current paths generated in a photodetecting element using the embedded type electrode is represented as shown in FIG. 2, in the photodetecting element according to the first embodiment. As shown in FIG. 2, two current paths generate due to reduction of the surface electrical resistance. A ZnO film 22 as an optical absorption layer is formed on a glass substrate 21. As the solid arrow shown in FIG. 2, when light is irradiated from an upper side, ultraviolet light is absorbed by the ZnO film 22. As a result, the light is detected as a current which flows between the electrode 23 and the electrode 24 by a photoelectric effect. As a path of such a detected current, as the arrow A shown in FIG. 2, the current generally flows through the direct distance between the electrode 23 and the electrode 24 from the electrode 23 to the electrode 24. However, since resistance of a surface layer of ZnO film 22 is unstable, the resistance of the surface layer becomes lower than those of other regions due to an oxygen deficiency of the surface, for example.

Accordingly, not only the current path A but also a current path B is generated by a surface electrical conduction by which the current flows from the electrode 23 through path B1→B2→B3 to the electrode 24. Thus, both of the current path A and the current path B1→B2→B3 contribute to the detected current. Since the current which flows through these two current paths is changed depending on a value of the surface electrical resistance of the optical absorption layer, variation is generated in electrical characteristics and sensitivity of each the photodetecting element.

More specifically, if a value of resistance of the surface layer of the optical absorption layer is set to Rs, a value of resistance at around the electrode is set to R1, and a value of resistance of a thickness direction of the photodetection film is set to Rt, the current path A becomes dominant in the case of $2Rt+Rs \gg R1$. The dominant current path can be determined whether or not there is a proportionality relation between an inter electrode distance and a value of resistance.

Figure 3:
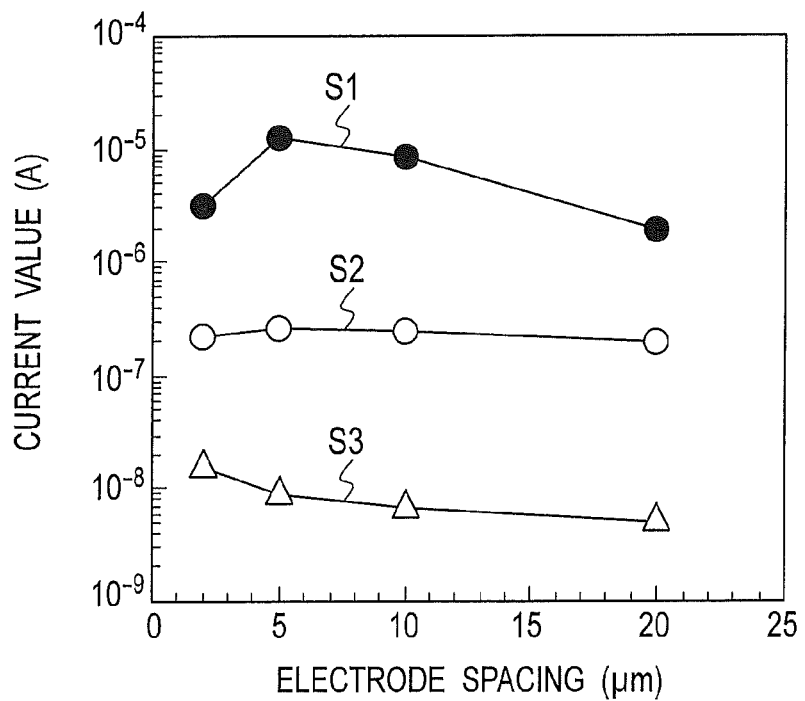
FIG. 3 is a graphic chart showing a relationship between a film thickness of an optical absorption layer and current versus electrode-spacing characteristics in the case of surface irradiation, in the photodetecting element according to the first embodiment.

FIG. 3 shows a graphic chart showing a relationship between a film thickness of the optical absorption layer and current versus electrode-spacing characteristics in the case of surface irradiation, in the photodetecting element according to the first embodiment.

A current value of the vertical axis of FIG. 3 indicates a detected current value in the case of applying a bias voltage 3V between the electrode 23 and the electrode 24 and irradiating therebetween with ultraviolet light from upward (surface irradiation). The horizontal axis indicates spacing (μm) between the electrode 23 and the electrode 24. The irradiated ultraviolet light with wavelength of 365 nm was emitted with output power of 30 W/m². The detected current value was measured as the inter electrode distance between the electrode 23 and the electrode 24 was changed. If the inter electrode distance is changed, the resistance between the electrodes is changed in the case of the current path A. However, since the equation 2Rt+Rs>>R1 is satisfied in the case of the current pathB1→B2→B3, the resistance between the electrodes is hardly changed.

The graph line S1 plotted with black dots indicates the case where the film thickness of the ZnO film 22 is 0.47 µm. The graph lines S2 plotted with white circles indicates the case where the film thickness of the ZnO film 22 is 1.03 µm. The graph lines S3 plotted with white triangles indicates the case where the film thickness of the ZnO film 22 is 2.3 µm. As proved in FIG. 3, even the film thickness of the optical absorption layer is decreased and/or the film thickness of the optical absorption layer is increased, there is no correlation between the electrode spacing and the detected current. This is because the influence of the surface electrical conduction is large, since the ZnO film 22 absorbs and detects almost all of the ultraviolet light in a region near the surface layer.

Figure 4:
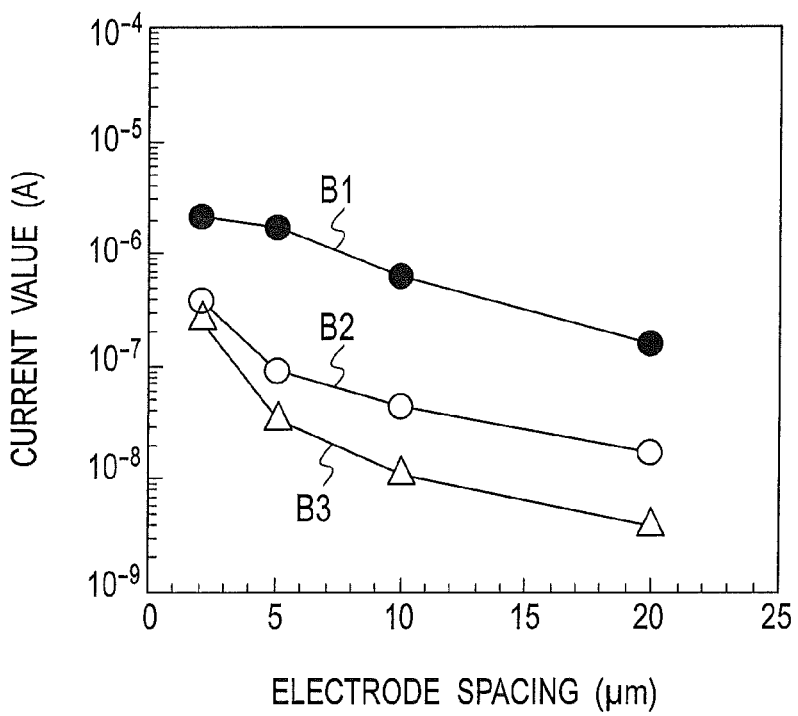
FIG. 4 is a graphic chart showing a relationship between a film thickness of an optical absorption layer and current versus electrode-spacing characteristics in the case of back side surface irradiation, in the photodetecting element according to the first embodiment.

FIG. 4 is a graphic chart showing a relationship between the film thickness of the optical absorption layer and the current versus electrode-spacing characteristics in the case of back side surface irradiation, in the photodetecting element according to the first embodiment.

A current value of the vertical axis of FIG. 4 indicates a detected current value in the case of applying a bias voltage 3V between the electrode 23 and the electrode 24 and irradiating therebetween with ultraviolet light from a back side surface (back side surface irradiation) in the same manner as for FIG. 3. The horizontal axis indicates spacing (µm) between the electrode 23 and the electrode 24. The irradiated ultraviolet light with wavelength of 365 nm is emitted with output power of 30 W/m$^2$. The detected current value was measured as the inter electrode distance between the electrode 23 and the electrode 24 was changed. If the inter electrode distance is changed, the resistance between the electrodes is changed in the case of the current path A.

A different point from FIG. 3 is that the detected current in the case of irradiating with light from the back side surface of the glass substrate 21 (back side surface irradiation) is represented as the dotted arrow shown in FIG. 2. The graph line B1 plotted with black dots indicates the case where the film thickness of the ZnO film 22 is 0.47 µm. The graph lines B2 plotted with white circles indicates the case where the film thickness of the ZnO film 22 is 1.03 µm. The graph lines B3 plotted with white triangles indicates the case where the film thickness of the ZnO film 22 is 2.3 µm. As proved in FIG. 4, in the case of the back side surface irradiation, the current value is decreased as the electrode spacing is increased, and such a tendency become still more remarkable as the film thickness is increased.

In the case of back side surface irradiation, since an absorption coefficient of the ultraviolet light area of the ZnO film is as high as $10^5$ cm$^{-1}$, the ultraviolet light is decreased approximately 3% at a position where the ultraviolet light travels 300 nm from an interface between the glass substrate 21 and the ZnO film 22 toward the ZnO film 22 side, and the ultraviolet light is decreased approximately $3 \times 10^{-9}$% at a position where the ultraviolet light travels 2 µm toward the ZnO film 22 side. Accordingly, since a low resistive layer is formed on the ZnO film at around the interface between the glass substrate 21 and the ZnO film 22, and R1 becomes small at the time of the ultraviolet radiation, a contribution of surface electrical conduction becomes small. Moreover, since if the film thickness of the ZnO film 22 is thick, the surface of the ZnO film 22 and the electrodes 23 and 24 are separated with a high resistivity layer of the middle of the ZnO film and therefore Rt becomes large, the ZnO film surface hardly contributes to the resistance between the electrode 23 and the electrode 24.

Figure 5:
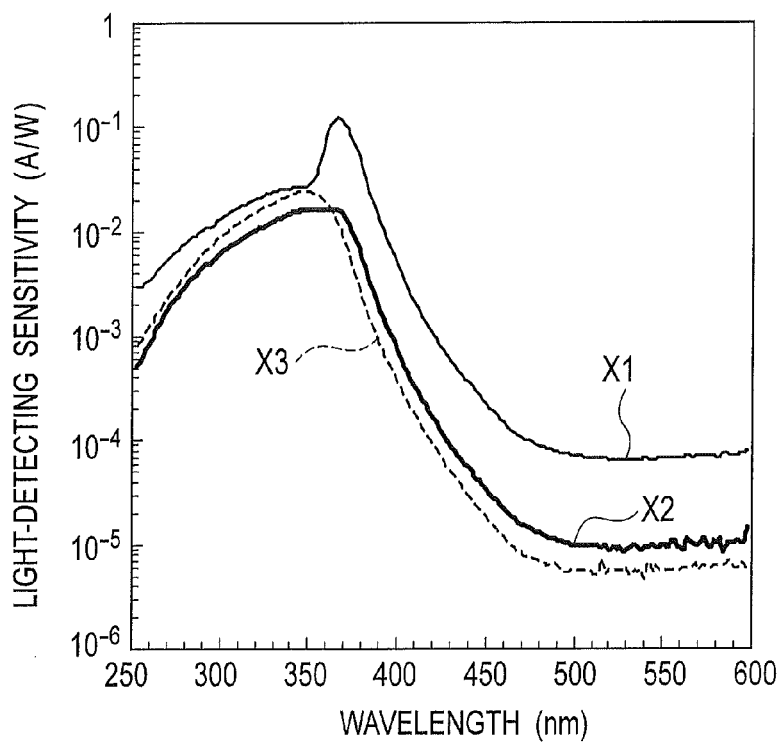
FIG. 5 is a graphic chart showing light-detecting sensitivity characteristics in the case of the back side surface irradiation, in the photodetecting element according to the first embodiment.

Next, light-detecting sensitivity at the time of the back side surface irradiation was measured, using the photodetecting element (FIG. 2) according to the first embodiment. In the photodetecting element according to the first embodiment, light-detecting sensitivity characteristics in the case of the back side surface irradiation are represented as shown in FIG. 5. A photodetecting element in which only the film thickness of the ZnO film 22 is changed without changing the inter electrode distance was used for the measurement of the light-detecting sensitivity. The film thickness of ZnO film 22 becomes thick in sequence of measured results X1, X2 and X3. That is, the film thickness of the measured result X3 is the thickest, and the film thickness of the measured result X1 is the thinnest. In the graphic chart shown in FIG. 5, the vertical axis of indicates light-detecting sensitivity (A/W), and the horizontal axis indicates a wavelength (nm).

As proved in FIG. 5, in the side where the film thickness of the ZnO film 22 is thinner, the spectral responsivity spectrum is shifted to a long wavelength side, and the sensitivity in the visible light wavelength region becomes high. The tendency appears remarkably in particular the measured result X1 using the thinnest ZnO film 22.

This is because the surface electrical conduction contributes, the sensitivity for visible light is increased, and the spectral responsivity spectrum is also shifted to the long wavelength side, since the visible light which is long wavelength is detected rather than ultraviolet light not near the interface between the glass substrate 21 and the ZnO film 22 but near the surface of the ZnO film if the film thickness of the ZnO film 22 is thin. Moreover, the surface electrical conduction layer may also absorb comparatively light of long wavelength.

Figure 6:
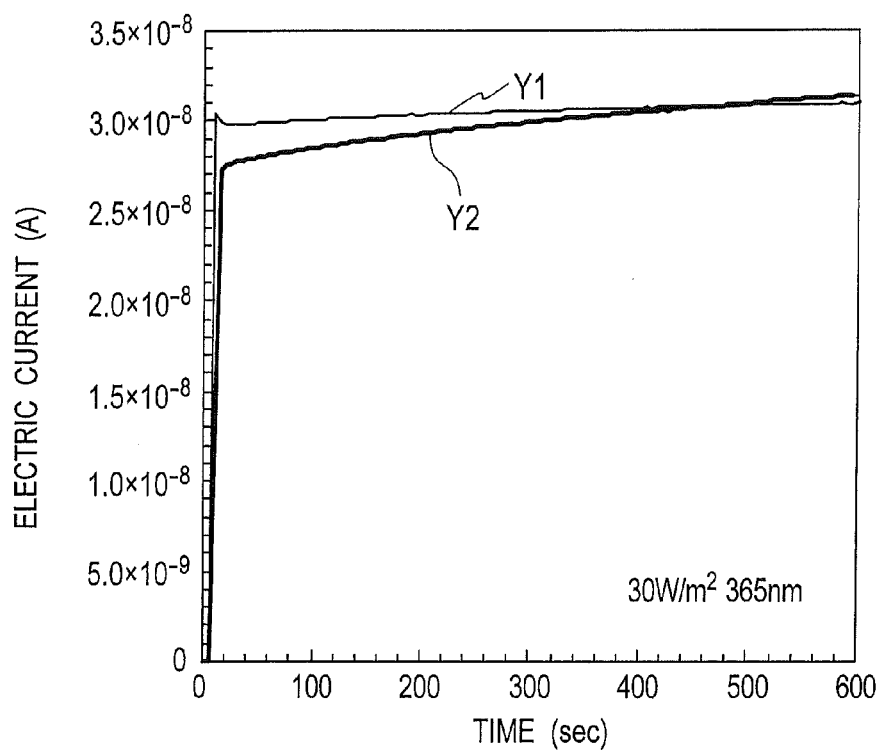
FIG. 6 is a graphic chart showing a comparison between a detected current of the surface irradiation and a detected current of the back side surface irradiation, in the photodetecting element according to the first embodiment.

In the photodetecting element (shown in FIG. 2) according to the first embodiment, a result of comparison between the detected current of the surface irradiation and the detected current of the back side surface irradiation is represented as shown in FIG. 6.

FIG. 6 shows a comparison result between the surface irradiation and the back side surface irradiation using the photodetecting element according to the first embodiment, and strength of ultraviolet light is the same as that of the conditions shown with regard to FIGS. 3-5. The measurement was performed using the ZnO film 22 whose film thickness is 2 µm. In the graphic chart shown in FIG. 6, the vertical axis indicates current values (A) of the detected currents, and the horizontal axis indicates irradiation time (sec). The line Y1 indicates a value of the detected current of the back side surface irradiation, and the line Y2 indicates a value of the detected current of surface irradiation. The current value Y1 of the detected current of the back side surface irradiation is stable even after irradiation time elapses. However, the current value Y2 of the detected current of the surface irradiation is increased gradually as the irradiation time of the ultraviolet light becomes long. In the case of the surface irradiation, since the surface electrical conduction contributes, in particular the surface electrical resistance is changed greatly, and thereby the current value thereof is also changed.

Thus, in the surface layer of the optical absorption layer, it is proved that not only the resistivity is unstable, but also the absorption spectrum is shifted to the long wavelength side rather than the optical absorption layer due to bulk. Moreover, it is also proved that the surface layer of the optical absorption layer is related also to reduction of speed of response of the photodetecting element.

As mentioned above, in order to prevent the influence of the surface electrical conduction, it proves that what is necessary is to adopt the back side surface irradiation, and to increase the film thickness of the optical absorption layer. Accordingly, since the resistance on the surface of the optical absorption layer does not contribute to the resistance between the electrodes, the influence of the surface electrical conduction is eliminable. Next, a configuration example for detecting a specified wavelength region selectively will be shown.

Figure 7:
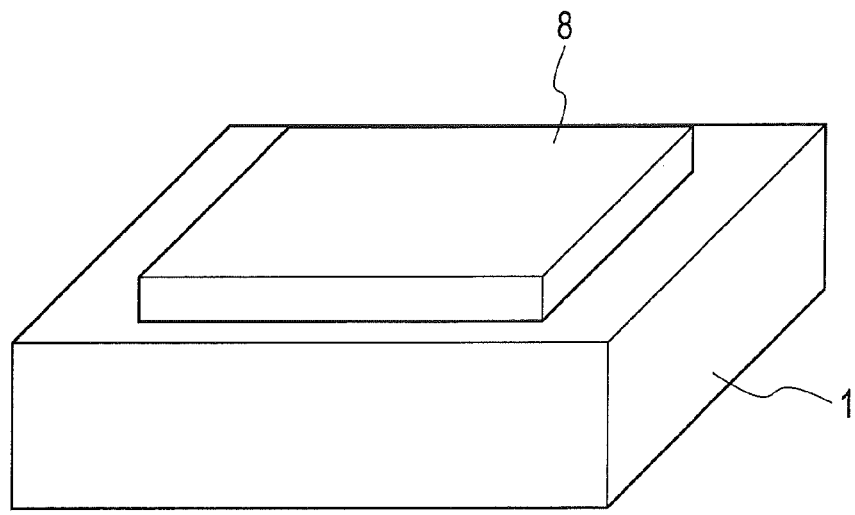
FIG. 7 is a schematic bird's-eye view showing a structure where an optical filter is formed on a surface of an optically transparent substrate, in the photodetecting element according to the first embodiment.

In the photodetecting element according to the first embodiment, a schematic bird's-eye view structure where an optical filter is formed on the surface of the optically transparent substrate is represented as shown in FIG. 7. FIG. 7 shows a layered structure in which an optical filter 8 is formed on the back side surface of the optically transparent substrate 1 shown in FIG. 1. For example, the case where ultraviolet light is detected is assumed.

In this case, an ultraviolet light wavelength region is a region of wavelengths not more than 400 nm but up to approximately 200 nm. The ultraviolet light wavelength region is further classified into ultraviolet light A (whose wavelength is larger than 320 nm but not more than 400 nm), ultraviolet light B (whose wavelengths is larger than 280 nm but not more than 320 nm), and ultraviolet light C (whose wavelength is not more than 280 nm).

As light intensity included in sunlight, the ultraviolet light A is 30 W/m$^2$, the ultraviolet light B is 1 W/m$^2$, and the light intensity of the ultraviolet light A is 10 or more fold of the light intensity of the ultraviolet light B. Accordingly, in order to evaluate the dangerousness of the sunlight including the ultraviolet light, it is necessary to detect the ultraviolet light A and the ultraviolet light B individually.

Consequently, the optical filter 8 configured to absorb and cut a specified wavelength is formed. The optical filter 8 is formed by hardening pasty substance. In the example shown in FIG. 7, a glass paste composed of composition $B_2O_3$—$Bi_2O_3$—$ZnO$ is used. The optical filter 8 composed of such a glass paste absorbs only wavelengths not more than that of the ultraviolet light B. The optical filter 8 can be fabricated by screen printing. The screen printing is a membranes film formation method which can form a thin film in an affordable price, and therefore is excellent in mass production.

A glass substrate was used for the optically transparent substrate 1, glass paste with a thickness of 2.5 μm which absorbs wavelengths not more than that of the above-mentioned ultraviolet light B was coated thereon, and thereby the layered structure shown in FIG. 7 was fabricated as the optical filter 8.

Figure 8:
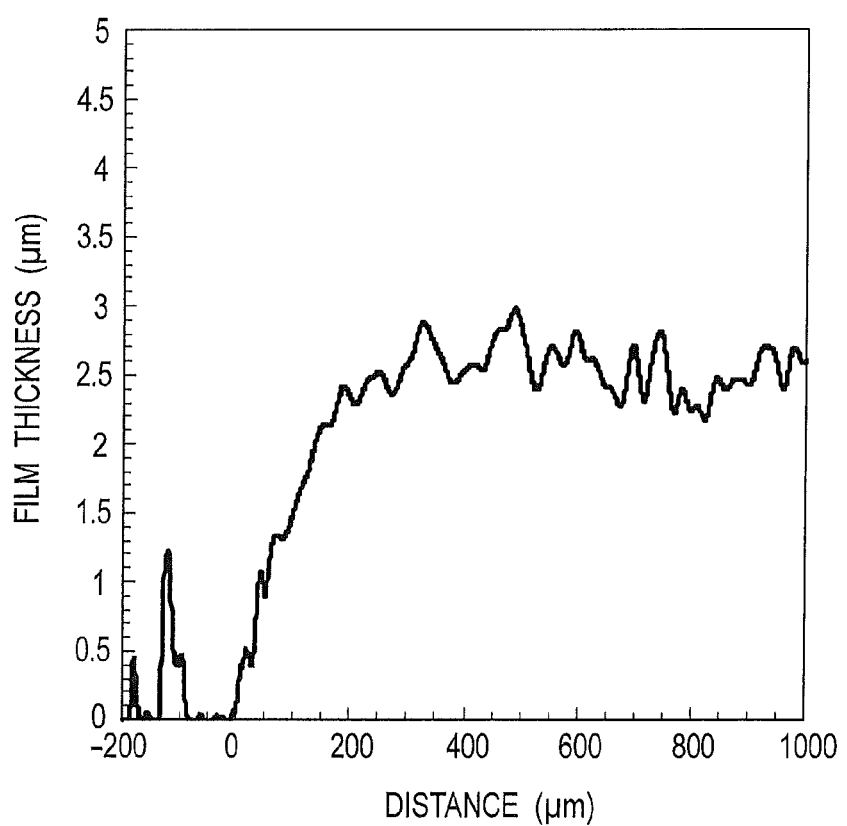
FIG. 8 is a graphic chart showing a formed state of a film thickness of the optical filter shown in FIG. 7, in the photodetecting element according to the first embodiment.

In the photodetecting element according to the first embodiment, a graphic chart showing a formed state of the film thickness of the optical filter shown in FIG. 7 is represented as shown in FIG. 8. In the graphic chart shown in FIG. 8, the vertical axis indicates a film thickness (μm) of the optical filter composed of glass paste, and the horizontal axis indicates a distance (μm) from an edge of the optically transparent substrate 1 toward a horizontal direction. That is, in the graphic chart of FIG. 8, a region where the film thickness larger than 0 is a region in which the optical filter 8 is formed, and a region where the film thickness is smaller than 0 is a region in which no optical filter 8 is formed, bordering on the distance 0. The region in which the optical filter 8 is formed is uniform to a value (2.5 μm) in which the film thickness is approximately constant.

Figure 9:
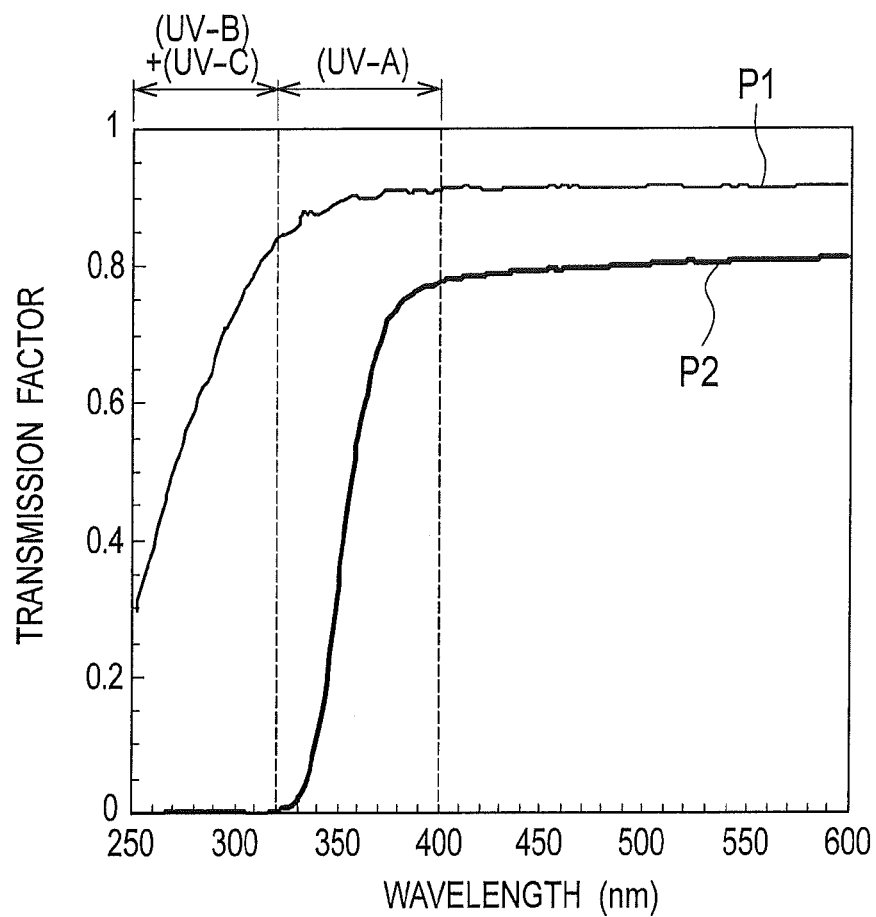
FIG. 9 shows a graphic chart showing a relationship between a wavelength and a transmission factor in the case of irradiating the structure shown in FIG. 7 with ultraviolet light, in the photodetecting element according to the first embodiment.

In the photodetecting element according to the first embodiment, a relationship between a wavelength and a transmission factor in the case of irradiating the structure shown in FIG. 7 with ultraviolet light is represented as shown in FIG. 9. FIG. 9 shows transmission characteristics at the time of irradiating the optical filter 8 with ultraviolet light and visible light from upward thereof using the layered structure shown in FIG. 7. In the graphic chart shown in FIG. 9, the vertical axis indicates a transmission factor and the horizontal axis indicates a wavelength (nm). In the graphic chart shown in FIG. 9, P1 indicates a state of the structure shown in FIG. 7 in which the optical filter 8 composed of glass paste is not formed (i.e., transmission characteristics only with the glass substrate). P2 indicates transmission characteristics with the layered structure shown in FIG. 7 in which the optical filter 8 is formed. Although the visible light, the ultraviolet light A, the ultraviolet light B, and the ultraviolet light C are transmitted in P2, the ultraviolet light B and the ultraviolet light C are removed in P1, and only the visible light and the ultraviolet light A are transmitted in P1.

Figure 10:
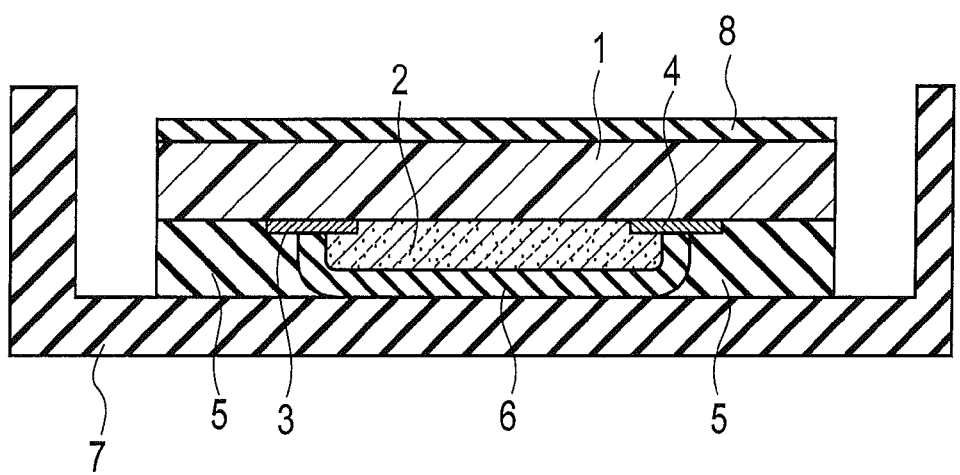
FIG. 10 is a schematic cross-sectional structure diagram showing a constructional example of the photodetecting element according to the first embodiment.
Figure 11:
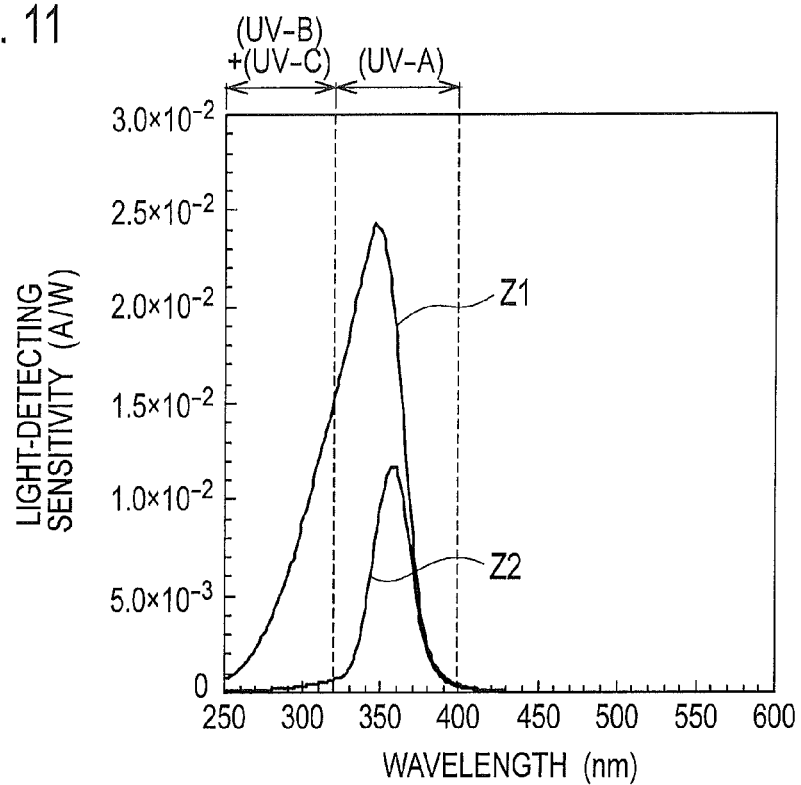
FIG. 11 is a graphic chart showing each light-detecting sensitivity in the case of irradiating the photodetecting element shown in FIGS. 1 and 10 with ultraviolet light, in the photodetecting element according to the first embodiment.

A schematic cross-sectional structure showing a constructional example of the photodetecting element according to the first embodiment is represented as shown in FIG. 10, and a graphic chart showing each the light-detecting sensitivity in the case of irradiating the photodetecting element shown in FIGS. 1 and 10 with ultraviolet light is represented as shown in FIG. 11.

FIG. 10 is a diagram showing a photodetecting device in which the optical filter 8 shown in FIG. 7 is formed in the photodetecting element shown in FIG. 1. The same reference numeral as that of FIG. 1 indicates the same structure. In FIG. 11, Z1 is a spectral responsivity spectrum measured with the ultraviolet light irradiated from the back side surface side of the optically transparent substrate 1 shown FIG. 1. On the other hand, in FIG. 11, Z2 is a spectral responsivity spectrum measured by the ultraviolet light irradiated from the back side surface side of the optically transparent substrate 1 shown FIG. 10.

The ultraviolet light A, the ultraviolet light B, and the ultraviolet light C are detected, in the spectral responsivity spectrum Z1. However, since the optical filter 8 absorbs only wavelengths not more than that of the ultraviolet light B, only the ultraviolet light A is detected, in the spectral responsivity spectrum Z2. Thus, only the light of the wavelength region of the specified range is selectively detectable by using combining the optical filter formed by hardening the pasty substance, with the photodetecting device shown FIG. 1.

Furthermore, the ultraviolet light is detected by using both of the photodetecting element shown in FIG. 1 and the photodetecting element shown in FIG. 10 to be calculated with (Z1-Z2), and thereby the ultraviolet light B and the ultraviolet light C can be detected.

As the pasty substance used for the optical filter, materials which allow light from the ultraviolet light to the infrared light to pass therethrough widely can be used. More specifically, an acrylic resin, an amorphous fluorine contained resin (amorphous fluoropolymers), a silicone resin, a fluorine contained resin, glass, etc. can be used, for example, as the pasty substance used for the optical filter. In particular, it is preferable that a coefficient of thermal expansion of the pasty substance is close to a coefficient of thermal expansion of the optically transparent substrate in which the optical filter is laminated, because the pasty substance becomes difficult to be removed.

Although the film thickness of the optical filter is not limited, it is preferable to form the film thickness of the optical filter approximately 0.1 to 5 μm when the difference between the coefficient of thermal expansion of the pasty substance and the coefficient of thermal expansion of the optically transparent substrate in which the optical filter is laminated is large. Furthermore, when coating the pasty substance to form the optical filter on the optically transparent substrate, it is preferable to use materials with low calcination temperature in order to reduce a manufacturing cost. As mentioned above, it is preferable to use a glass based materials as a principal constituent of the paste, for example, from a viewpoint of the coefficient of thermal expansion and the calcination temperature.

Moreover, the optical filter can be also fabricated by hardening materials in which semiconductor particles is doped, applying the pasty substance as a principal constituent. In this case, as the semiconductor particles, it is not preferable to use semiconductor granular materials having a particle size which becomes cloudy when being doped to the pasty substance. This is because not only the ultraviolet light but also the visible light etc. cannot easily pass through the optical filter, and light which reaches the optical absorption layer is decreased and therefore becomes impossible to be detected.

Here, a fabrication method of the photodetecting device shown in FIG. 10 will now be explained briefly. As a detailed material, glass is used for the optically transparent substrate 1, and a Ti/Pt multi-layered metal film in which a Pt (platinum) layer is laminated on a Ti (titanium) layer is used for the electrodes 3 and 4. Moreover, $Mg_xZn_{1-x}O$ (0<=X<0) is used for the optical absorption layer 2.

The glass paste is coated on the back side surface of the optically transparent substrate 1 composed of the glass by using screen printing. As the glass paste, glass paste which absorbs wavelengths not more than that of the ultraviolet light B is used. Let the glass paste dry at 120 degrees C. for 10 minutes, and performing calcination at 450 degrees C. for 30 minutes, and thereby a film which absorbs only wavelengths not more than that of the ultraviolet light B is formed. Although such a film thickness depends on printing conditions, film thickness of approximately 2 μm can be applicable. The ultraviolet light B cannot be absorbed if the film thickness is too thin, but it will become a cause by which the film is removed if the film thickness is too thick.

On the surface of the glass substrate (optically transparent substrate 1), electrodes composed of Ti/Pt are formed approximately 10 nm/50 nm to be comb-shaped. A method by using lift-off process may be used for the process of forming an electrode, and a method by using etching may be also used therefor. When a width of the detecting electrodes (corresponding to the electrodes 3 and 4) of the comb-shaped electrode is not more than approximately 5 μm, it is preferable to use the method using etching, from the viewpoint of securing reproducibility.

Next, MgZnO film acting as the optical absorption layer 2 is formed by sputtering. It is preferable to form the MgZnO film in thickness of equal to or greater than 1000 nm. If the film thickness of the MgZnO film is too thin, an influence of the surface electrical conduction layer becomes large, and therefore deterioration of characteristics (e.g. there is light-detecting sensitivity also in a comparatively long-wavelength region) will occur.

The MgZnO film which covers an edge part of the comb-shaped electrode is removed by wet etching using diluent hydrochloric acid. Although dry etching may be used for the removal of the MgZnO film, since a residue in ZnO based materials remains easily, it is simple and preferable to use the wet etching.

Next, the insulating film 6 composed of an SiN film is formed by CVD. In order to secure reliability, it is preferable to form the insulating films 6 in thickness of equal to or greater than 300 nm. The insulating film 6 may be composed of a multilayered structure as SiO2/SiN for example, instead of being composed of a single layer.

The SiN film which covers the edge part of the comb-shaped electrode is removed by using an RIE method. Next, the glass substrate (optically transparent substrate 1) is polished to be formed thinly. Although it is not necessary to form the glass substrate thinly, the package 7 can be formed thinly if the photodetecting element is formed thinly in the case where a thin-shaped photodetecting device is fabricated.

The photodetecting unit completed as mentioned above is die-bonded and packaged junction down with the adhesive agent (adhesive layer 5) which has an electrical conductivity of Ag paste etc. on a supporting base which becomes the package 7, for example.

The above-mentioned packaged photodetecting element is mounted on a printed circuit board, for example. Furthermore, the printed circuit board is mounted in a housing, a sealing cover is attached thereon, and then the photodetecting device is completed.

Figure 12:
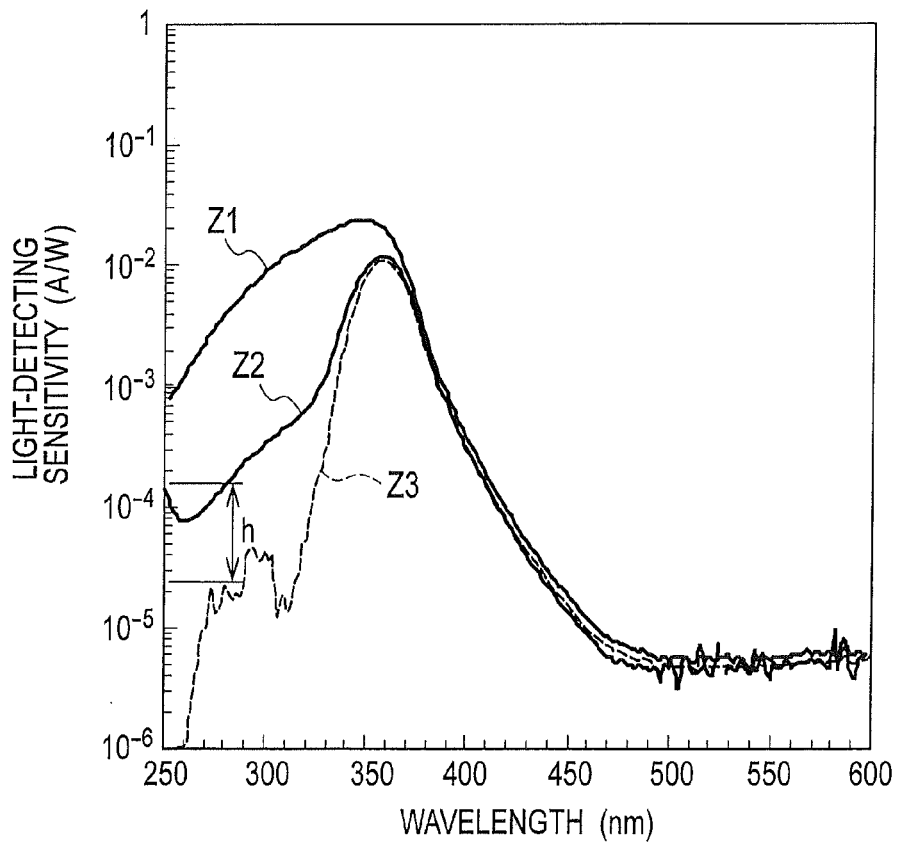
FIG. 12 shows a graphic chart showing comparison between measured light-detecting sensitivity shown in FIG. 11 and theoretical light-detecting sensitivity.

FIG. 12 shows a graphic chart showing comparison between measured light-detecting sensitivity shown in FIG. 11 and theoretical light-detecting sensitivity. A result of investigating an influence of light-receiving from the side surface of the photodetecting element shown in FIG. 10 is represented in FIG. 12. In the graphic chart of FIG. 12, the vertical axis indicates a value in which the light-detecting sensitivity of the vertical axis of the graphic chart shown in FIG. 11 is converted into the logarithmic scale. The scale of the horizontal axis of FIG. 12 is the same as that of FIG. 11. Measured light-detecting sensitivities Z1 and Z2 are shown in the graphic chart of FIG. 12 in the same manner as for the graphic chart of FIG. 11. A curved line Z3 is a transmission spectrum of the optical filter 8 composed of the glass paste (i.e., light-detecting sensitivity curved line calculated and obtained from P2 shown in FIG. 9).

If the measured light-detecting sensitivity curved line Z2 is compared with the theoretical light-detecting sensitivity curved line Z3, the sensitivity of the wavelength region of not more than that of the ultraviolet light B is higher by an amount of height h shown in FIG. 12, as for the measured light-detecting sensitivity curved line Z2. This is because the ultraviolet light entered from the side surface of the optically transparent substrate 1 is detected. Accordingly, in order to detect exactly the ultraviolet light A, it is necessary to form also the filter which cuts the wavelength not more than that of the ultraviolet light B on the side surface of the optically transparent substrate 1. However, it hardly becomes a problem, as long as an amount of ultraviolet light included in the sunlight with low strength of the wavelength region not more than that of the ultraviolet light B is measured.

Figure 13:
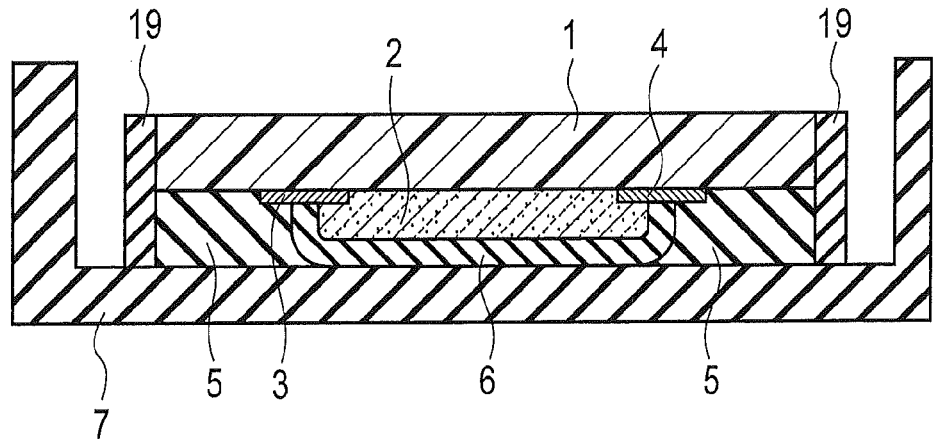
FIG. 13 is a schematic cross-sectional structure diagram showing a structure in which an insulating film is formed on a side surface of an optically transparent substrate of the photodetecting element shown in FIG. 1, in the photodetecting element according to the first embodiment.
Figure 14:
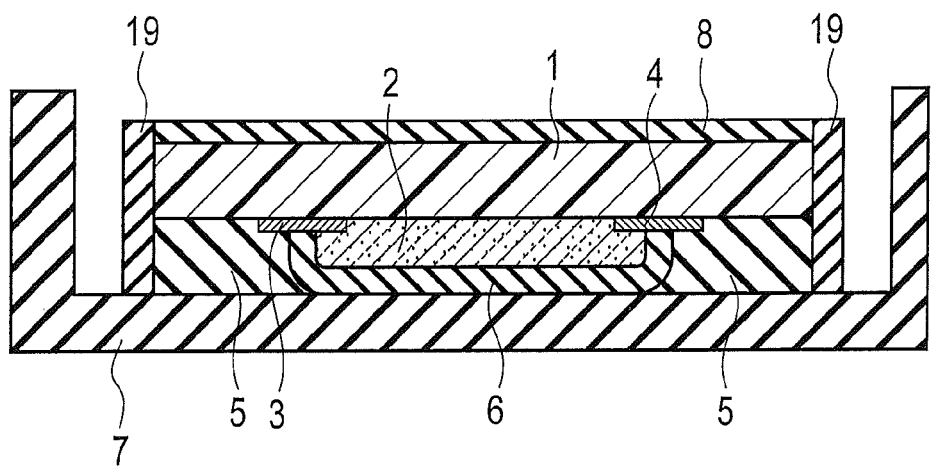
FIG. 14 is a schematic cross-sectional structure diagram showing a structure in which an insulating film is formed on a side surface of an optically transparent substrate of the photodetecting element shown in FIG. 10, in the photodetecting element according to the first embodiment.

In the photodetecting element according to the first embodiment, a schematic cross-sectional structure in which the insulating film is formed on the side surface of the optically transparent substrate of the photodetecting element shown FIG. 1 is represented as shown in FIG. 13, and a schematic cross-sectional structure in which the insulating film is formed on the side surface of the optically transparent substrate of the photodetecting element shown in FIG. 10 is represented as shown in FIG. 14.

Examples of structures for preventing the incident of the ultraviolet light from the side surface are represented in FIGS. 13 and 14. FIG. 13 shows a structure in which the insulating film 19 is formed on the side surface of the photodetecting element shown in FIG. 1. The insulating film 19 is formed so that the side surface of the optically transparent substrate 1 may be covered completely. The insulating film 19 is composed of materials (e.g., SiN) which absorb the ultraviolet light.

FIG. 14 shows a structure in which the insulating film 19 is formed on the side surface of the photodetecting element shown in FIG. 10. In the same manner as for FIG. 13, the insulating film 19 is formed so that the side surface of the optically transparent substrate 1 may be covered completely. Moreover, the insulating film 19 is composed of materials (e.g., SiN) which absorb the ultraviolet light.

Figure 15:
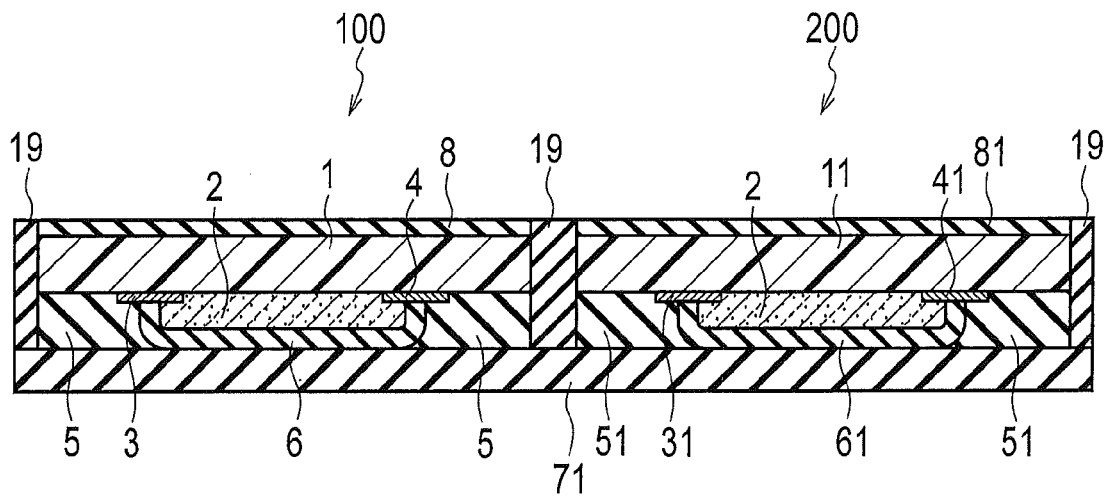
FIG. 15 is a schematic cross-sectional structure diagram showing a constructional example of the photodetecting device according to the first embodiment.

An example of a photodetecting device composed by using the above-mentioned photodetecting element is represented in FIG. 15. The above photodetecting device is provided with a supporting layer 71 in common. An insulating film composed of $SiO_2$ or SiN may be used for the supporting layer 71, for example. A light-detecting element 100 equivalent to one photodetecting element and a light-detecting element 200 equivalent to one photodetecting element are formed on the supporting layer 71. The light-detecting elements 100 and 200 are elements which detect the light irradiated from the upper side of the diagram, and are formed in the approximately same size.

The light-detecting element 100 and the light-detecting element 200 are formed bordering on the interlayer insulating film 19. The light-detecting element 100 is composed of an optically transparent substrate 1, an optical absorption layer 2, an electrode 3, an electrode 4, an adhesive layer 5, and an insulating film 6. The optical absorption layer 2 is formed on the optically transparent substrate 1, and the optical absorption layer 2 is formed so that a part of each of the electrode 3 and the electrode 4 is covered. When the electrode 3 is a positive electrode, the electrode 4 is equivalent to a negative electrode, and when the electrode 3 is a negative electrode, the electrode 4 is equivalent to a positive electrode.

The electrodes 3 and 4 are formed on the optically transparent substrate 1, and a part of each the electrode 3 and 4 are embedded in the optical absorption layer 2. A surface and a side surface of the optical absorption layer 2 are covered completely with the insulating film 6, and both ends of the insulating film 6 are formed on the electrode 3 and 4. An adhesive layer 5 is formed on the both sides of the insulating film 6, and the optically transparent substrate 1 and the supporting layer 71 are bonded with the adhesive layer 5.

The light-detecting element 100 is flip-chip bonded junction down to the supporting layer 71 with the adhesive layer 5. The insulating film 19 is the same as the insulating film explained with FIGS. 13 and 14. Materials of the insulating film 19 are limited in particular if the materials have a property as a passivation film, but it is preferable to use materials which absorb light to be detected.

On the other hand, the light-detecting element 200 is composed of an optically transparent substrate 11, an optical absorption layer 2, an electrode 31, an electrode 41, an adhesive layer 51, and an insulating film 61. The optical absorption layer 2 is formed on the optically transparent substrate 11, and the optical absorption layer 2 is formed so that a part of each of the electrode 31 and the electrode 41 is covered. That is, a part of each the electrode 31 and 41 is embedded in the optical absorption layer 2. Since materials which composes the photodetecting device except for the optical filter is approximately the same as that of the light-detecting element 100, and the joint relation between each composing element is the same as that of the light-detecting element 100, explanation thereof is omitted.

On the other hand, an optical filter 8 is formed on an entire back surface of the optically transparent substrate 1, and an optical filter 81 is formed on an entire back surface of the optically transparent substrate 11. The optical filter 8 is formed by hardening pasty substance which does not include a semiconductor particle or a pasty substance including a semiconductor particle, and corresponds to a filter which absorbs light of a specified wavelength region.

On the other hand, the optical filter 81 is formed by hardening pasty substance which does not include a semiconductor particle or a pasty substance including a semiconductor particle, and corresponds to a film which absorbs light of a specified wavelength region or which does not absorb light of a specified wavelength region.

The glass paste composed of the composition $B_2O_3$—$Bi_2O_3$—ZnO described above is used as the optical filter 8. That is, the optical filter 8 absorbs wavelengths not more than that of the ultraviolet light B. The optical filter 81 is a film composed of glass paste. That is, the optical filter 81 is a film which allows the ultraviolet light, visible light, infrared light, etc. to pass therethrough, and does not absorb light of a specified wavelength.

Accordingly, as explained with the photodetecting elements shown in FIGS. 1 and 10, the ultraviolet light A is detectable with the light-detecting element 100. The ultraviolet light B and the ultraviolet light C are detectable with light-detecting sensitivity T3 (T3=T1−T2) as a result of which the light-detecting sensitivity curved line T2 of the light-detecting element 100 is subtracted from the light-detecting sensitivity curved line T1 of the light-detecting element 200.

Figure 16:
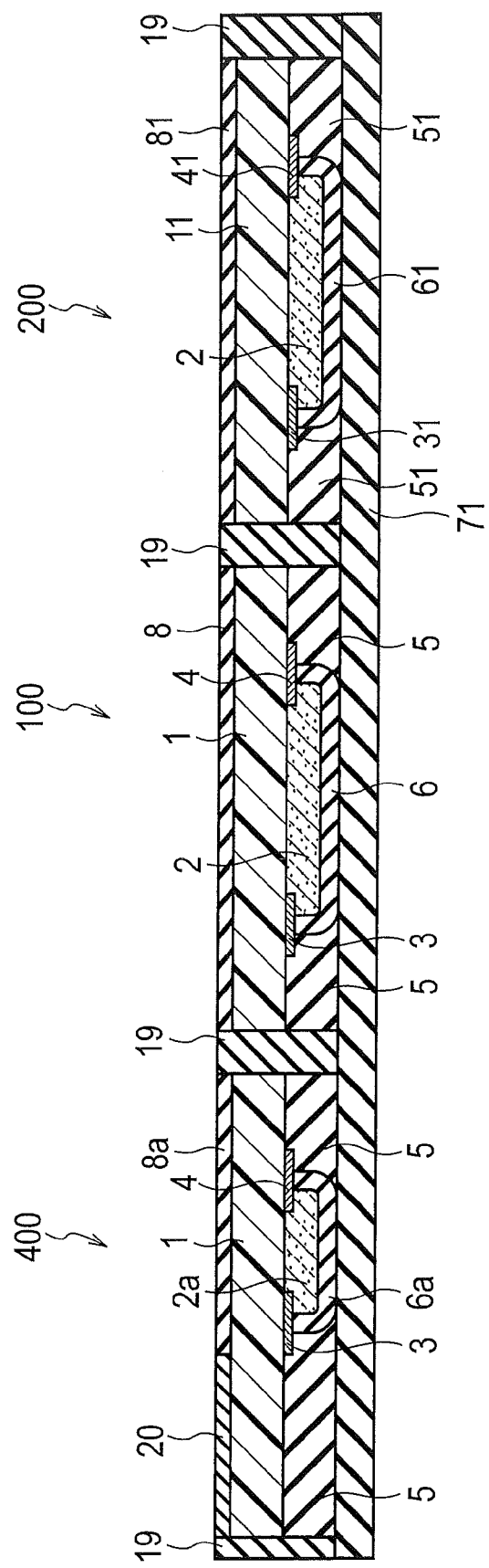
FIG. 16 is a schematic cross-sectional structure diagram showing a constructional example of the photodetecting device according to the first embodiment.

A schematic cross-sectional structure showing a constructional example of the photodetecting device according to the first embodiment is represented as shown in FIG. 16. In FIG. 16, a light-detecting element 400 of the same structure same as that of the light-detecting element 100 is formed so as to have a different light-detecting area from a light-detecting area of the light-detecting element 100, in addition to the structure shown in FIG. 15. Next, the light-detecting element 400 as a photodetecting element will now be explained briefly. The light-detecting elements 100, 200 and 400 are formed bordering on the interlayer insulating film 19 on the common supporting layer 71.

The light-detecting element 400 is composed of an optically transparent substrate 1, an optical absorption layer 2a, an electrode 3, an electrode 4, an adhesive layer 5, an insulating film 6a, and an insulating film 20. Explanation is omitted about the same part as the light-detecting element 100. A different point from the light-detecting element 100 is a point that a light-detecting area of the optical absorption layer 2a is formed to be smaller than a light-detecting area of the optical absorption layer 2 in order to receive light in a different area rather than to receive the light in the area same as the optical absorption layer 2 which has a photoelectric-conversion operation. Furthermore, a light-detecting area of the optical filter 8a is formed to be small in accordance with the light-detecting area of the optical absorption layer 2a. The insulating film 20 is formed on the back side surface of the optically transparent substrate 1 in which the optical filter 8a is not formed, and on the surface of the optically transparent substrate 1 in which the optical absorption layer 2a is not formed.

The optical filter 8a is formed by hardening pasty substance which does not include a semiconductor particle or a pasty substance including a semiconductor particle, and corresponds to a light absorption layer which absorbs light of a specified wavelength region. Moreover, the optical filter 8a is composed the same material as that of the optical filter 8 of the light-detecting element 100, and is composed a light absorption film which absorbs light of a certain wavelength range λ (a range from a lower limit wavelength λL to an upper limit wavelength λU). Accordingly, the optical filter 8 is also composed similarly of a light absorption film which absorbs light of a wavelength range λ (a range from a lower limit wavelength λL to an upper limit wavelength λU).

On the other hand, the optical filter 81 of the light-detecting element 200 is formed by hardening a paste of an amorphous fluorine contained resin etc. which have a high transmission factor extremely in respect to not only the ultraviolet light but also from the visible light to the infrared light. In this case, the range from the ultraviolet light to the infrared light including the visible light is assumed as a range of wavelengths from 200 nm to 1200 nm.

The light-detecting area of the optical absorption layer 2 of the light-detecting element 100 is set as A1, and the light-detecting area of the optical absorption layer 2*a* of the light-detecting element 400 is set as A4. A detection signal of a wavelength range λ0 in which a wavelength range λ is excepted from the wavelength range of the ultraviolet light to the infrared light is measured based on a differential signal between the light-detecting element 100 and the light-detecting element 400. As for each the light-detecting element 100 and the light-detecting element 400, the light of the wavelength range λ is cut by each the optical filter 8 and 8*a*. Therefore, a difference (I1−I4) of detected photo currents between the light-detecting element 100 and the light-detecting element 400 is based on the light of the wavelength range λ0 in which a wavelength range λ is excepted from the wavelength range of the ultraviolet light to the infrared light. If the photo-electric current excited when the light of the wavelength range λ0 is entered per unit area of the light-detecting area A1 is set to J0, the light-detecting area S4 in the light-detecting element 400 is similarly set to J0, and the following equation is satisfied.

$$(I1-I4)=(A1-A4) \times J0$$

J0 is calculated easily, since (I1−I4) is determined by measurement and calculation and (A1−A4) is also determined at the time of design. If J0 is calculated, a difference of a result of subtracting (J0×A2) from an amount of the photo-electric currents of the light-detecting element 200 (J2×A2) indicates an amount of light of the wavelength range λ0, as follows:

an amount of light of the wavelength range λ0={(J2×A2)−(J0×A2)} where A2 is the light-detecting area of the light-detecting element 200 which does not have an absorption region in the range from the ultraviolet light to the infrared light, and J2 is a photo-electric current expressed in per unit area of the light-detecting area A2. J2 is a result of detecting the light from the ultraviolet light to the visible light and the infrared light. The value of A2 may be the same as that of A1. However, in order to prevent a cancellation of significant digits of numerical significant figures in difference calculation as much as possible, the final amount of light of the wavelength range λ0 may be calculated by preparing a plurality of combination from which different light-detecting areas of the light-detecting elements including the optical filter which absorbs the light the wavelength range λ with respect to the above-mentioned light-detecting elements 100, 200 and 400, and calculating a whole average and deviation of each combination.

Moreover, it can also detect independently the sensitivity of each region of the ultraviolet light A, the ultraviolet light B, and the ultraviolet light C by using four above light-detecting elements. A structure of the optical filter is not limited to the above-mentioned example, but may be formed of pasty substance so that other semiconductor particles may be included.

Figure 17:
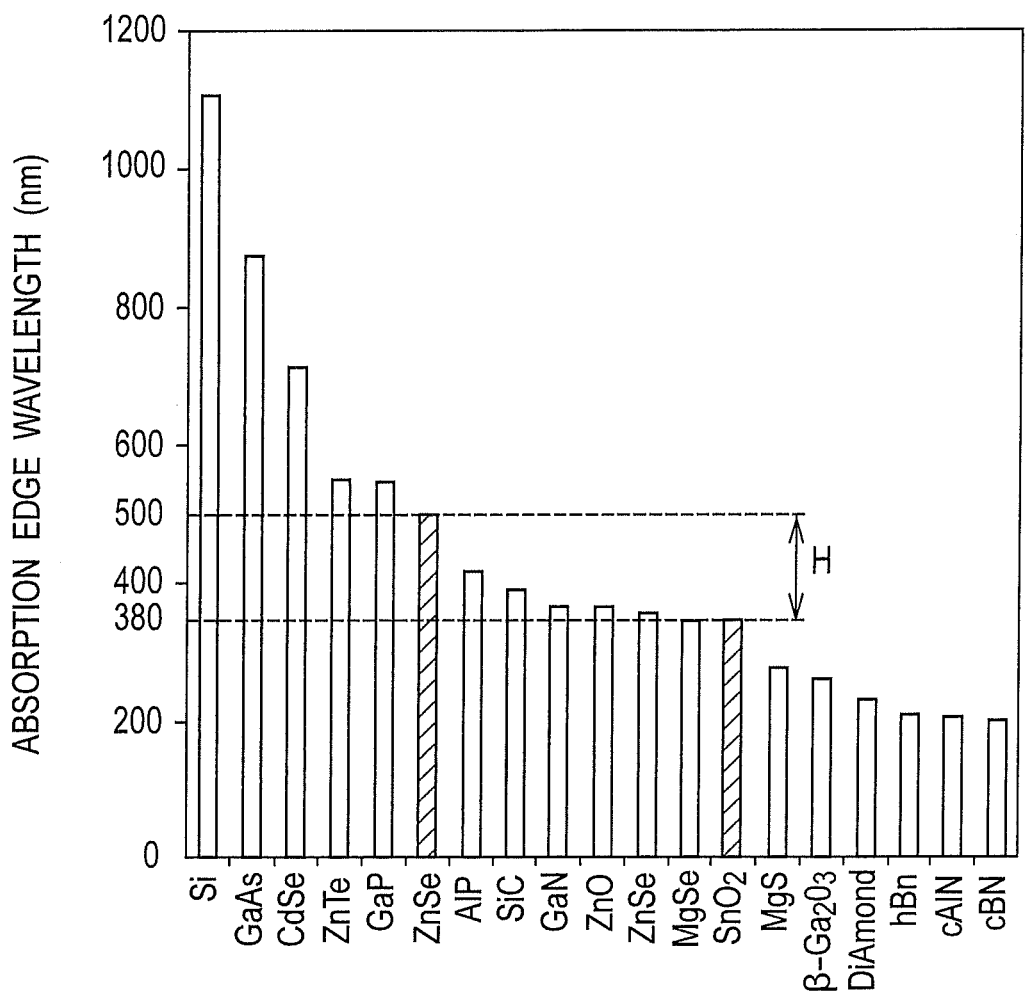
FIG. 17 shows a graphic chart showing a kind of semiconductor, and an absorption edge wavelength of each the semiconductor.

A graphic chart showing a kind of semiconductor and an absorption edge wavelength of each the semiconductor is represented as shown in FIG. 17. Here, a schematic cross-sectional structure showing a constructional example of the photodetecting device according to the first embodiment is represented as shown in FIG. 15. Although the kind of semiconductor particles which can be used for the optical filter is described in FIG. 17, if a filter with which GaAs particles are doped is used for the optical filter 8 and a filter with which CdSe particles are doped is used for the optical filter 81 as an example in the structure shown in FIG. 15, a photodetecting device which has sensitivity only in a range from 870 nm to 710 nm (from absorption edge wavelength of GaAs to absorption edge wavelength of CdSe) can be composed.

As another example, if a filter with which $SnO_2$ particles are doped is used for the optical filter 8 and a filter with which ZnSe particles are doped is used for the optical filter 81 in the structure shown in FIG. 15, A photodetecting device which has sensitivity only in a range from 380 nm to 500 nm (from absorption edge wavelength of $SnO_2$ to absorption edge wavelength of ZnSe) can be composed.

Furthermore, a photodetecting device which can detect light of arbitrary wavelength ranges can be composed by using of ternary mixed crystal based MgZnO, InGaAs, InGaN, etc., such as AlGaAs, and adjusting composition ratios thereof to adjust a bandgap.

In this case, the above-mentioned optical filters 8, 8*a* and 81 may be composed of dielectric multilayers etc. However, there are disadvantages that the dielectric multilayer requires cost for formation of the optical filter, and a cut wavelength region is changed depending on incident angles of light. However, materials which have precipitous change of the absorption coefficient in a band end as a semiconductor can be used also as the above optical filters. Therefore, a function as the above optical filters can be achieved by forming only one layer, and the cut wavelength range does not change even if a film thickness thereof is changed. Moreover, there is also no angular dependence of incident light. In the flip chip structure, it is not necessary to pattern if the filter is beforehand coated on the back side surface of the substrate.

Second Embodiment (Photodetecting Device)

Hereinafter, with reference to FIGS. 18 and 19, a photodetecting device according to a second embodiment will be explained.

Note that the same reference numeral is attached to the similar composing element as the photodetecting device according to the first embodiment, and detailed explanation is omitted.

Figure 18:
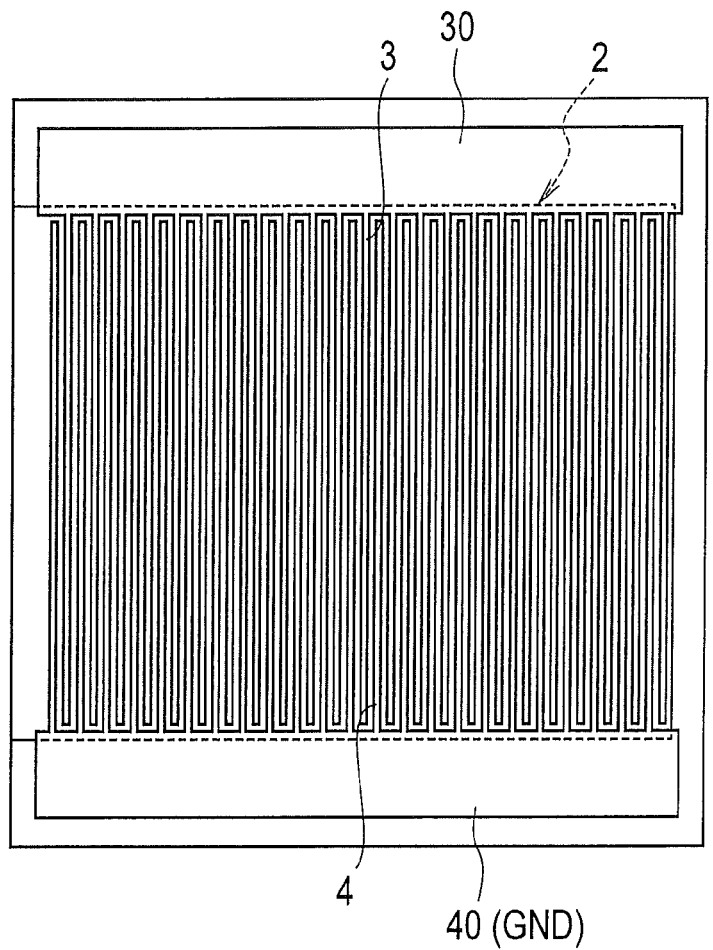
FIG. 18 is a top view diagram showing a configuration example of a photodetecting device according to a second embodiment.
Figure 19:
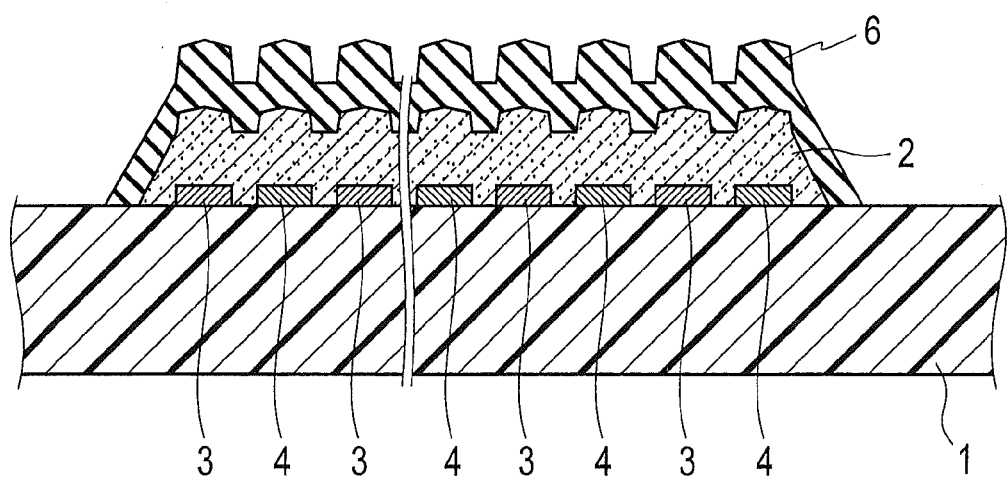
FIG. 19 is a schematic cross-sectional structure diagram showing the photodetecting device according to the second embodiment.

As shown in FIGS. 18 and 19, the photodetecting device according to the second embodiment includes: an optically transparent substrate 1; an optical absorption layer 2 which absorbs light formed on the optically transparent substrate 1; detecting electrodes 3 and 4 formed on the optically transparent substrate 1; and an insulating film 6 formed so that a surface of the optical absorption layer 2 is covered. At least a part of each the detecting electrode 3 and 4 is embedded in the optical absorption layer 2, light is radiated from a back side surface of the optically transparent substrate 1, the detecting electrodes 3 and 4 detect a current generated from the optical absorption layer 2, and the optical absorption layer 2 is composed of a thin film of $Ga_2O_3$.

As shown in FIG. 18, the detecting electrodes 3 and 4 are composed a pair of the electrodes, and each the electrode is formed to be comb-shaped so that teeth of a comb are mutually engaged at predetermined spacing.

Although the comb shape of the detecting electrodes 3 and 4 is not limited in particular, it is formed, for example, to be 10-μm pitches etc.

Note that the detecting electrode 3 is connected to a +3V positive electrode 30, and the detecting electrode 4 is connected to a 0V ground electrode 40.

Accordingly, a bias voltage of +3V is applied to the detecting electrodes 3 and 4.

In FIG. 19, the detecting electrode 3 is formed of Pt, and the insulating film 6 is formed of SiN.

According to the photodetecting device according to the second embodiment, when irradiating thereon with sunlight, the light-detecting sensitivity spectrum which indicates a correlative relationship between the light-detecting sensitivity and the wavelength can be approximated with the CIE operational spectrum of UV-B. Details will be described later.

(Influence of Ultraviolet Light Exerted on Human Body)

The ultraviolet light is classified into three kinds, UV-A (315 nm to 400 nm), UV-B (280 nm to 315 nm), and UV-C (200 nm to 280 nm), in accordance with wavelengths thereof.

Generally, although an adverse action of ultraviolet light for a human body (living being) is so large that a wavelength is short, since UV-C is completely absorbed in the oxygen molecule on upside of the atmosphere and in ozone of the stratosphere, and UV-C does not reach a ground surface even if an ozone amount is decreased to some extent, UV-C does not become a problem with respect to living things.

UV-B causes damage to important biological material (e.g., nucleic acid), and exerts an effect on a person's health (e.g., an increase in light aging (a fleck or wrinkles) or skin cancer, an increase in a cataract, and immunosuppression), and it is anxious that a negative effect is also exerted on terrestrial and aquatic ecosystems.

(Intensity of Ultraviolet Light)

An intensity of the ultraviolet light which reaches the surface of the earth is different in accordance with wavelengths thereof.

Figure 20:
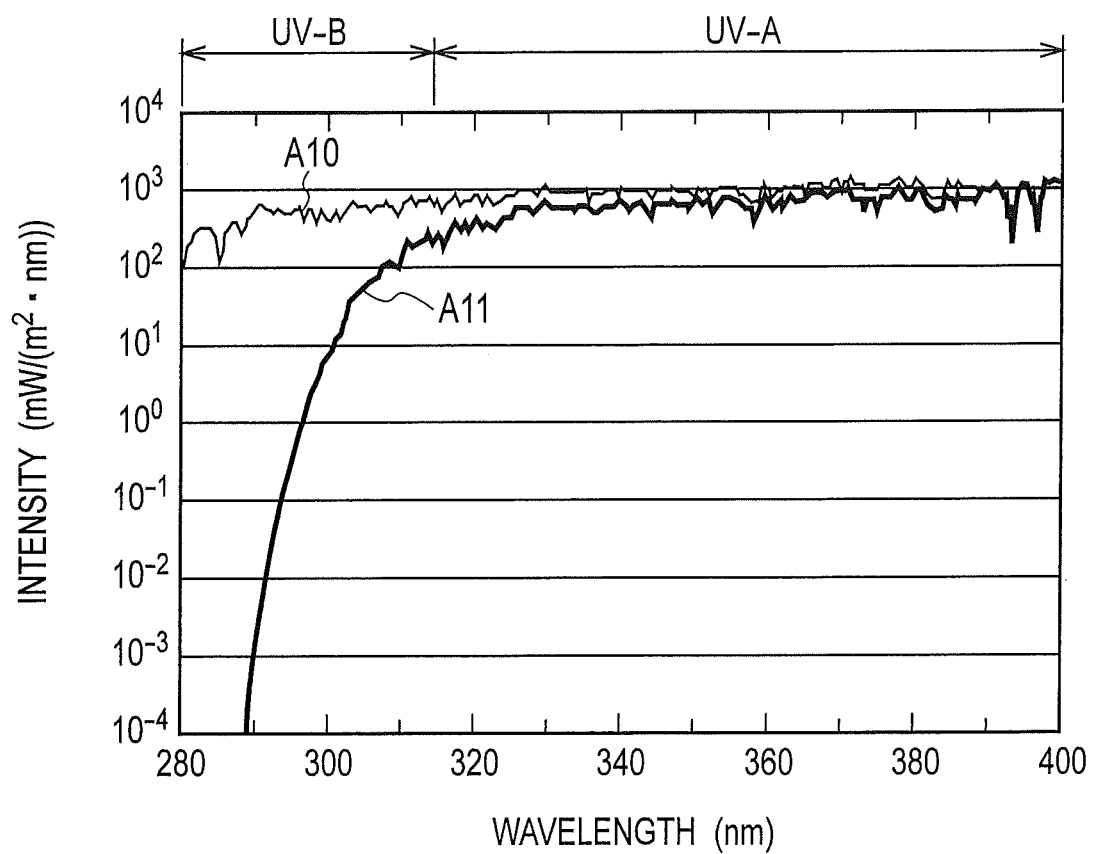
FIG. 20 shows a graphic chart showing intensity for each wavelength in the exoatmosphere of ultraviolet light (A10), and a surface of the earth at the time of fine weather (A11).

FIG. 20 shows a graphic chart showing intensity for each wavelength in the exoatmosphere of ultraviolet light (A10), and a surface of the earth at the time of fine weather (A11). As proved from FIG. 20, UV-B is greatly decreased on the surface of the earth compared with the intensity thereof in an exoatmosphere.

The UV-B is decreased greatly due to absorption of the stratospheric ozone mainly, as the wavelength thereof becomes short.

The UV-A is decreased slightly due to an influence of scattering by atmospheric molecules or aerosol (particulates of fluid or solid which floats in the atmosphere), and the influence of scattering becomes large as the wavelength thereof becomes short.

(Amount of Dosage of Erythema Ultraviolet Light Irradiation)

As mentioned above, a degree of incidence of the ultraviolet light with respect to the human body is different in accordance with the wavelengths.

With regard to a relative influence rate with respect to the human body for each wavelength, the CIE operational spectrum defined by the Commission Internationale de L'Eclairage (CIE) is generally used. The CIE operational spectrum means an action curved where erythema (red-tanned skin) in human beings' skin is caused.

Figure 21:
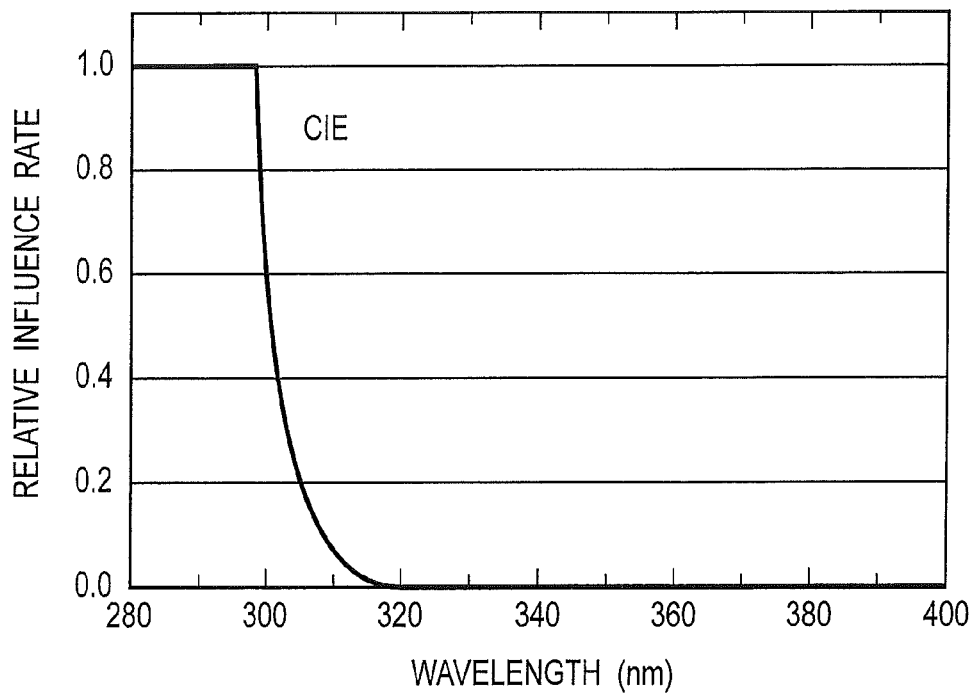
FIG. 21 shows a graphic chart showing a relation between a relative influence rate and a wavelength of the CIE operational spectrum.

The relative influence rate of the CIE operational spectrum is shown in FIG. 21. Note that erythema ultraviolet light means the ultraviolet light which causes a red-tanned skin. As shown in FIG. 21, the relative influence rate becomes high on the wavelength of 280-300 nm in the UV-B region, and becomes low rapidly from the wavelength of 300 nm in the UV-B region to the wavelength of 320 nm entered into the UV-A region. Moreover, the relative influence rate becomes nearly 0 on the wavelength of equal to or greater than 320 nm.

Figure 22:
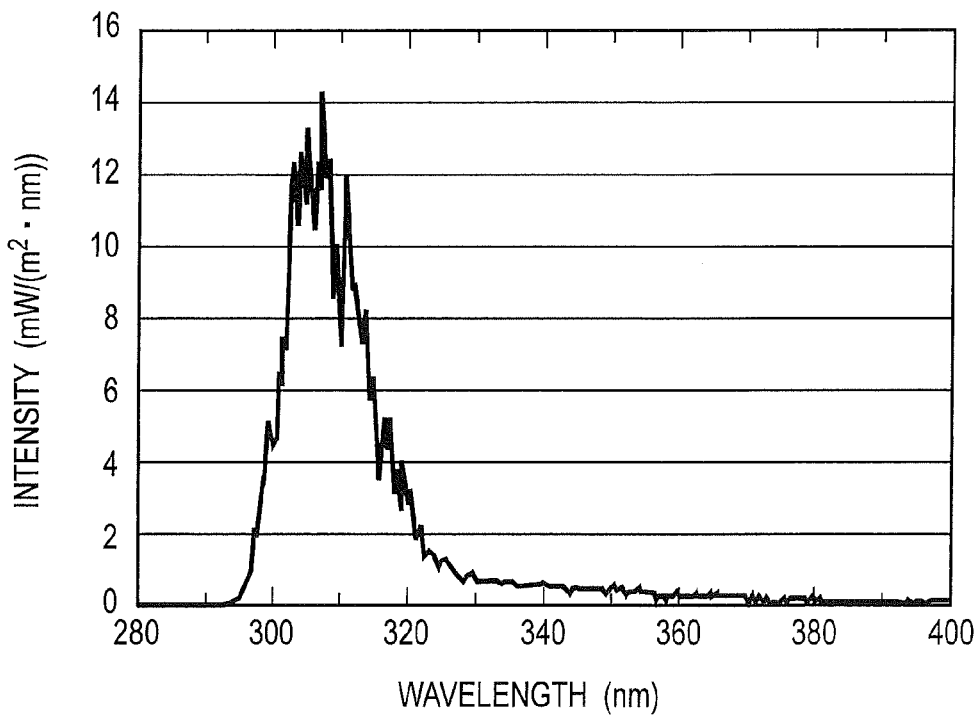
FIG. 22 shows a graphic chart showing a relationship between erythema ultraviolet ray intensity and a wavelength.

Note that the erythema ultraviolet ray intensity is calculable by multiplying the ultraviolet ray intensity for each wavelength by the CIE operational spectrum (Refer to FIG. 22). Furthermore, an amount of dosage of the erythema ultraviolet light irradiation (area in the waveform shown in FIG. 22) is calculated by performing wavelength integration of the above value.

It can be said that the amount of dosage of the erythema ultraviolet light irradiation is an index to which a strength of influence with respect to human beings' health more exactly reflected, as compared with an amount of UV-B calculated by integrating simply without taking the relative influence rate into consideration with regard to the ultraviolet ray intensity for each wavelength.

Here, a definitional equation of the CIE operational spectrum is expressed by the following equations:

$$S_{er}(\lambda) = 1.0 \quad (250 \text{ nm} < \lambda < 298 \text{ nm})$$

$$S_{er}(\lambda) = 10^{0.094(298-\lambda)} \quad (298 \text{ nm} < \lambda < 328 \text{ nm})$$

$$S_{er}(\lambda) = 10^{0.015(139-\lambda)} \quad (328 \text{ nm} < \lambda < 400 \text{ nm})$$

where $S_{er}$ is the CIE operational spectrum, and $\lambda$ is the wavelength.

(UV Index)

The UV index is an index developed by World Health Organization (WHO) in collaboration with World Meteorological Organization (WMO), United Nations Environment Program (UNEP), etc., as an index for indicating intelligibly the level of the amount of dosage of the ultraviolet light irradiation which reaches the ground. The object of the UV index is to educate necessity for UV protection with respect to the general public.

The UV index is an index to which the amount of dosage of the erythema ultraviolet light irradiation is divided by 25 mW/m$^2$ so that the above-mentioned amount of dosage of the erythema ultraviolet light irradiation is converted to a simple easy-to-use numerical value in everyday life.

For example, in "Health Care Manual for UV" published by the Ministry of Environment of Japan, or a commentary of UV protection stated by the World Health Organization (WHO), a rank of the UV index is set to 1 to 11+ (11+ includes rank of 11 or more).

In the Japan Meteorological Agency, the ultraviolet ray intensity is measured each 0.5 nm with respect to the wavelengths from 290 nm to 325 nm, and an amount contributed of wavelength regions (325 nm to 400 nm) where observation is omitted is estimated using an observed value of wavelength of 324 nm based on a result of model calculation, when calculation of the UV index.

The photodetecting device (UV-B sensor) according to the second embodiment can be fabricated small-sized with an affordable price, and is measurable in the UV index simply with one chip.

Therefore, the photodetecting device according to the second embodiment can be mounted in portable devices (e.g., a cellular phone, a wrist watch, etc.), and an influence (e.g., receiving excessive doses of the ultraviolet light) can be avoided by always carrying the photodetecting device to measure environmental ultraviolet light.

(Characteristics of Photodetecting Device (UV-B Sensor) According to Second Embodiment)

Figure 23:
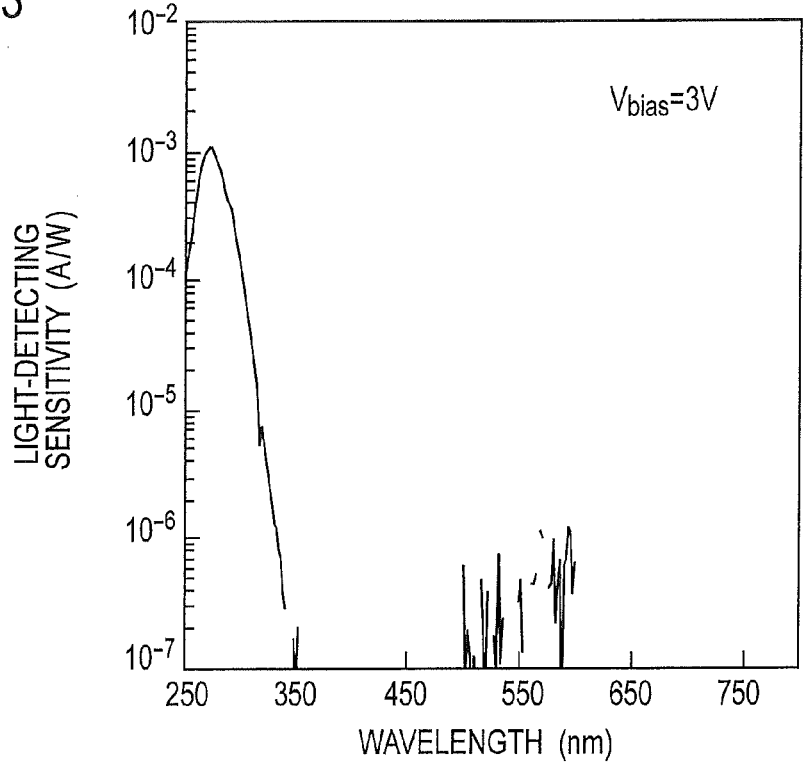
FIG. 23 shows a graphic chart showing sensitivity characteristics with respect to UV-B.

FIG. 23 shows a graphic chart showing sensitivity characteristic of the UV-B of the photodetecting device according to the second embodiment.

Figure 24:
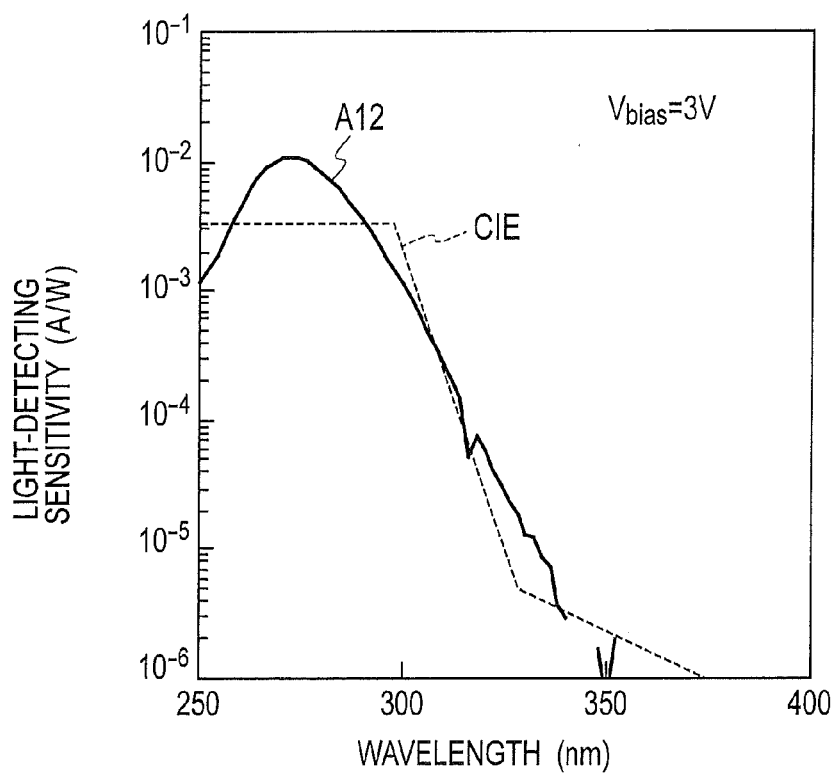
FIG. 24 shows a graphic chart showing a relation between light-detecting sensitivity and a wavelength of the light-detecting sensitivity spectrum (A12), and light-detecting sensitivity and a wavelength of the CIE operational spectrum.

FIG. 24 shows a graphic chart showing a relation between light-detecting sensitivity and a wavelength of the light-detecting sensitivity spectrum (A12), and light-detecting sensitivity and a wavelength of the CIE operational spectrum. As proved from the graphic chart shown in FIG. 24, the curved line (CIE) of the CIE operational spectrum defined by the Commission Internationale de L'Eclairage (CIE), and the curved line (A12) of the light-detecting sensitivity spectrum by the photodetecting device (UV-B sensor) according to the second embodiment are delineated in agreement with each other comparatively.

Thus, according to the photodetecting device (UV-B sensor) according to the second embodiment, it is possible to measure the UV index in simply.

Third Embodiment (Auto Lighting Device)

An auto lighting device according to a third embodiment includes: anyone of the photodetecting devices (UV sensor) which detects external ultraviolet light according to the first to second embodiment; an illuminance detecting device which detects external illuminance; and a control device which turns ON and OFF a lighting device based on a detecting result by the photodetecting device and the illuminance detecting device.

Moreover, the control device is controllable to turn ON the lighting device when any one of a detecting result by the photodetecting device and a detecting result by the illuminance detecting device becomes not more than a predetermined threshold value, and to turn OFF the lighting device when any one of the detecting result by the photodetecting device and the detecting result by the illuminance detecting device becomes not less than the predetermined threshold value.

Moreover, the lighting device can be applied as a lighting fixture mounted in vehicles (e.g., automobile, a bicycle, etc.) or a lighting fixture mounted in a streetlight.

Figure 25:
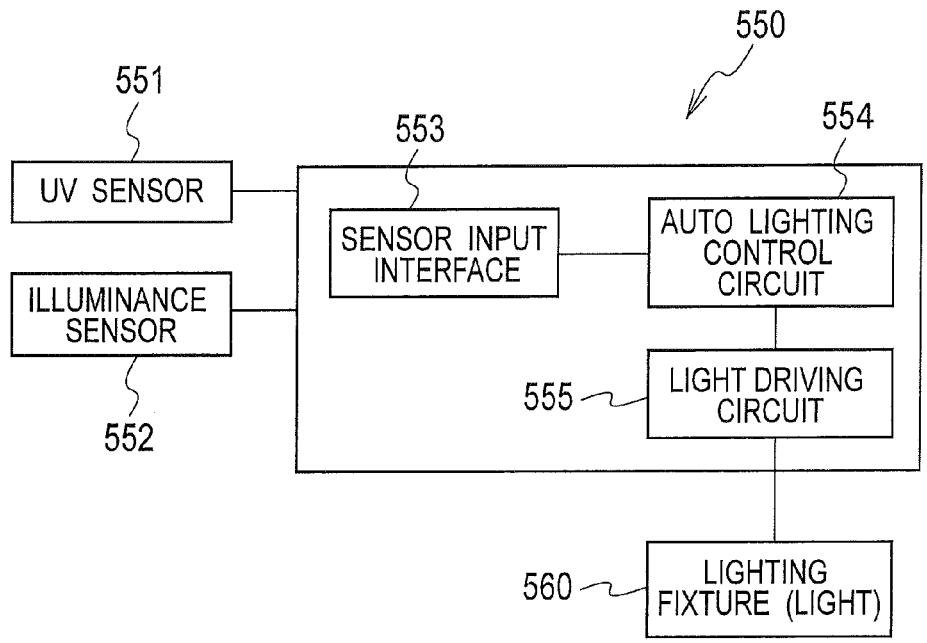
FIG. 25 is a block diagram showing a schematic structure of an auto lighting device according to a third embodiment.

As shown in a block diagram of FIG. 25, a photodetecting device (UV sensor) 551 and an illuminance sensor 552 are connected to an auto lighting device 550 according to the third embodiment via a sensor input interface 553.

As the UV sensor 551, any one of the photodetecting devices according to the first and second embodiment can be used.

As the illuminance sensor 552, a type using a phototransistor, a type using photodiode, a type in which the amplifier circuit is added to the photodiode, etc. are applicable.

An auto lighting control circuit 554 and a light driving circuit 555 are connected to the sensor input interface 553.

A lighting fixtures 560 (e.g., an automotive headlight, a taillight, a bicycle light for use in night travel, or an electric light bulb of a streetlight) are connected to the light driving circuit 555.

The auto lighting control circuit 554 controls the light driving circuit 555 to turn ON the lighting fixture 560 when any one of a detecting result of ultraviolet light by the UV sensor 551 and a detecting result of the visible light by the illuminance sensor 552 becomes not more than the predetermined threshold value, and to turn OFF the lighting fixture 560 when any one of the detecting result of ultraviolet light by the UV sensor 551 and the detecting result of the visible light by the illuminance sensor 552 becomes not less than predetermined threshold value.

Figure 26:
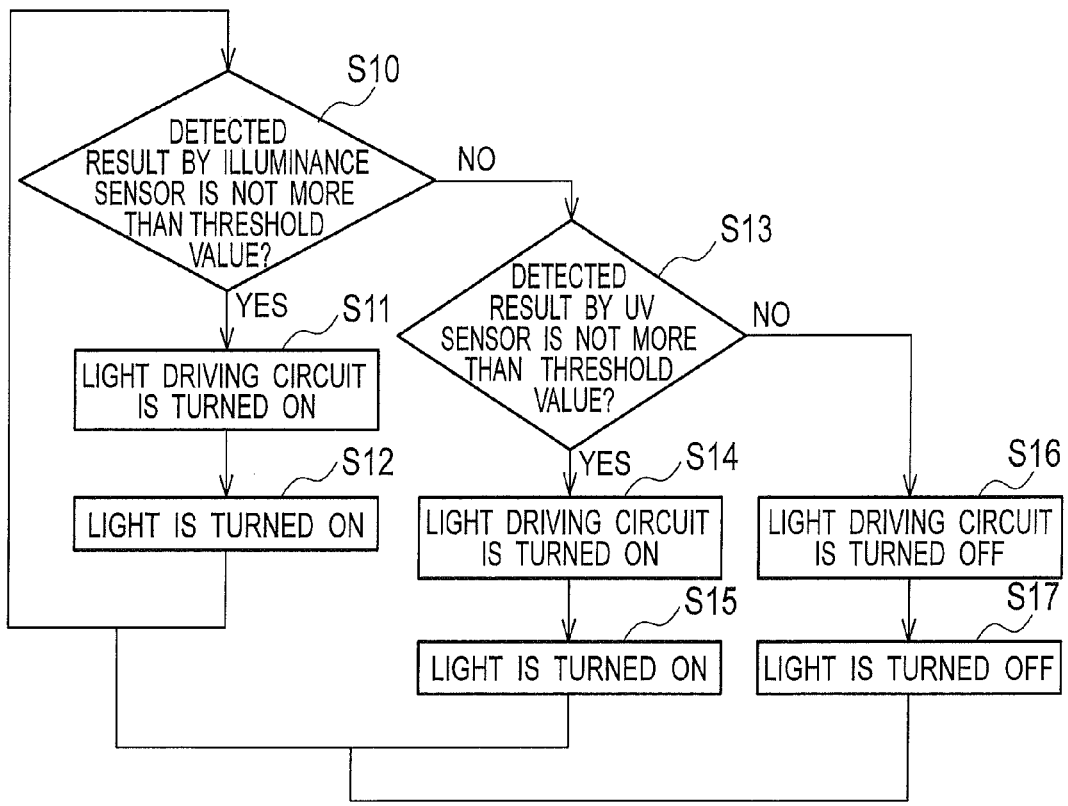
FIG. 26 is a flow chart showing an example of a procedure of driving processing of the auto lighting device according to the third embodiment.

FIG. 26 is a flow chart showing an example of a procedure of driving processing of the auto lighting device according to the third embodiment.

When the process is started, first of all, in Step S10, it is determined whether a detecting result of the visible light by the illuminance sensor 552 is not more than the threshold value. If a result of the determination is "Yes", the process goes to Step S11.

In Step S11, the light driving circuit 555 is turned ON, and then the process goes to Step S12. In Step S12, the light 560 is turned ON, and the process returns to Step S10.

Accordingly, when a detecting results of the illuminance and ultraviolet light become not more than the threshold value, the similar operation that the light (e.g., automobile) is turn ON as the operation of so-called general auto lighting device.

On the other hand, if a result of the determination is "No" in Step S10, the process goes to Step S13.

In Step S13, it is determined whether a detecting result of the ultraviolet light (UV-A or UV-B) by the UV sensor 551 is not more than the threshold value, and if a result of the determination is "Yes", the process goes to Step S14.

In Step S14, the light driving circuit 555 is turned ON, and then the process goes to Step S15. In Step S15, the light 560 is turned ON, and the process returns to Step S10.

Accordingly, when a detecting result of the illuminance is not less than the threshold value but a detecting result of ultraviolet light is not more than the threshold value, an operation that the light (e.g., automobile) is turn ON which is not in a general auto lighting device.

Accordingly, even if a detecting result of the illuminance is not less than the predetermined value, for example, lights (e.g., automobile) can be turned ON automatically under an environment to which the visibility is reduced (e.g., in cloudy weather, in a fog, etc.) by setting the threshold value into a suitable value, and safety and convenience can be improved.

On the other hand, if a result of the determination is "No" in Step S13, the process goes to Step S16.

In Step S16, the light driving circuit 555 is turned OFF, and then the process goes to Step S17. In Step S17, the light 560 is turned OFF, and the process returns to Step S10.

The driving processing of the auto lighting device according to the third embodiment is not limited to the above process. For example, when a detecting result of the ultraviolet light is not less than the predetermined value even if a detecting result of the illuminance is not more than the a predetermined value (e.g., cloudy weather under a predetermined condition, etc.), it is also effective so that the light of automobile or the streetlight is not turned ON. Accordingly, it can control that an unnecessary light is turned on and thereby power saving can be achieved.

Moreover, when a detecting result of the ultraviolet light by the UV sensor 551 becomes not less than the threshold value, it is also effective so that a fog lamp etc. mounted in automobile is turned ON automatically in a situation where the ultraviolet light is strong (e.g., on a snowy road).

(Application Example of Auto Lighting Device to Automobile)

Figure 28C:
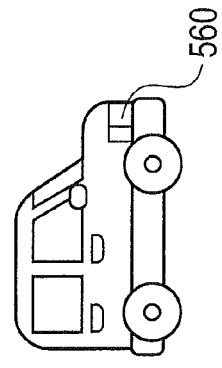
FIG. 28C is an explanatory diagram showing an operation situation in the case of mounting the auto lighting device according to the third embodiment in automobile to be functioned as the illuminance sensor and the UV sensor, and is a schematic diagram corresponding to the case where a automotive headlight 560 is turned OFF state again after passing under the elevated bridge 600 etc.
Figure 28B:
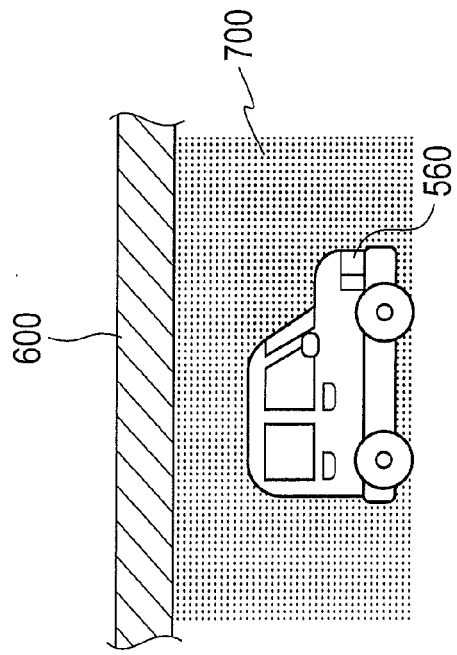
FIG. 28B is an explanatory diagram showing an operation situation in the case of mounting the auto lighting device according to the third embodiment in automobile to be functioned as the illuminance sensor and the UV sensor, and is a schematic diagram corresponding to the case where it travels for a comparatively short distance of shady areas 700, e.g. under the elevated bridge 600.
Figure 28A:
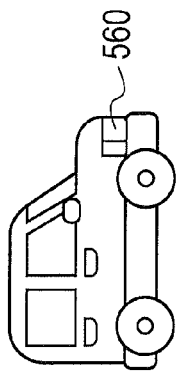
FIG. 28A is an explanatory diagram showing an operation situation in the case of mounting the auto lighting device according to the third embodiment in automobile to be functioned as the illuminance sensor and UV sensor, and is a schematic diagram corresponding to the case of traveling under an environment where sunlight including ultraviolet light is shined from the sun 800.
Figure 28A:
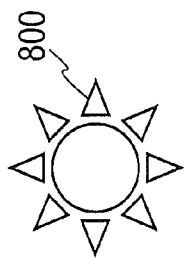
Figure 29:
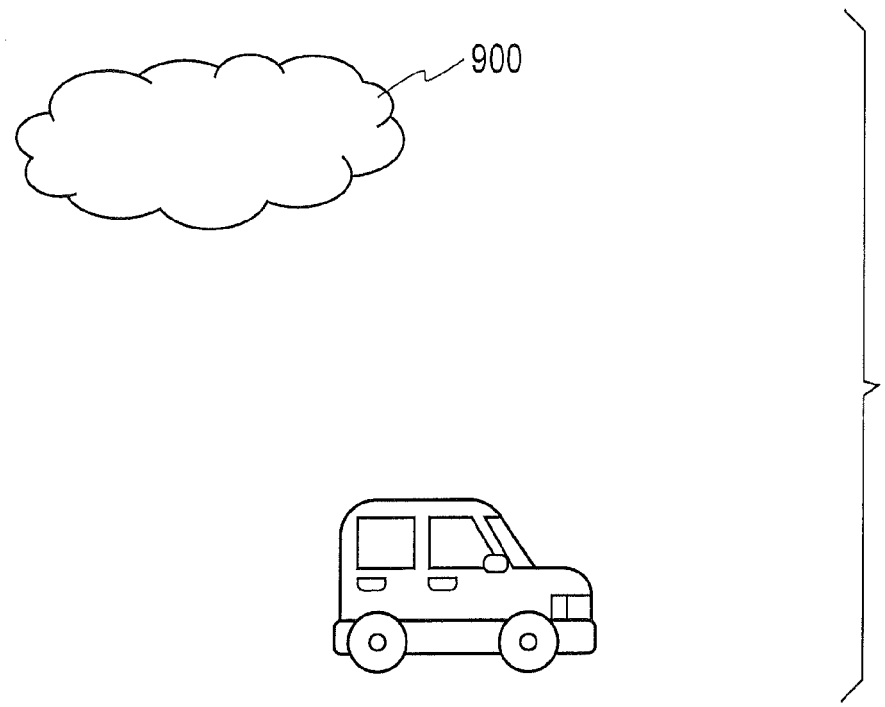
FIG. 29 is an explanatory diagram showing an operation situation in the case of mounting the auto lighting device according to the third embodiment in automobile to be functioned as only the illuminance sensor under cloudy weather or rainy weather.

With reference to FIGS. 27-29, an application example of the auto lighting device 550 according to the third embodiment to an automobile will now be explained.

FIG. 27 is an explanatory diagram showing an operation situation in the case of mounting the auto lighting device 550 according to the third embodiment in an automobile to be functioned as only an illuminance sensor.

The UV sensor 551 and the illuminance sensor 552 of the auto lighting device 550 are disposed on an automotive dashboard etc., for example. Accordingly, the sunlight and the ultraviolet light to be measured are incident into the UV sensor 551 and the illuminance sensor 552 via a front window from the outside of the automobile.

Since a result of the measurement of the visible light by the illuminance sensor 552 becomes not less than the threshold value when traveling under an environment where the sunlight including ultraviolet light is shined from the sun 800 as shown in FIG. 27, a lights-out state of the automotive headlight 560 is kept up as shown in FIG. 27A.

Subsequently, for example, since a result of the measurement of the visible light by the illuminance sensor 552 becomes not more than the threshold value when traveling on shady areas 700 for a comparatively short distance (e.g., under an elevated bridge 600) as shown in FIG. 27B, a headlight 560 of the automobile is shifted to a lighted state. Note that when traveling on the shady area for the comparatively short distance, the headlight 560 is unnecessary, but it can be said generally that a driver does not have enough time for performing the lights-out operation.

Since a result of the measurement of the visible light by the illuminance sensor 552 becomes not less than the threshold value after passing under the elevated bridge 600 etc., the headlight 560 of the automobile is shifted to the lights-out state again as shown in FIG. 27C.

FIG. 28C is an explanatory diagram showing an operation situation in the case of mounting the auto lighting device 550 according to the third embodiment in automotive to be functioned as the illuminance sensor and the UV sensor.

Since a result of the measurement of the visible light by the illuminance sensor 552 and a result of the measurement by the UV sensor 551 become not less than the threshold value when traveling under an environment where the sunlight including ultraviolet light is shined from the sun 800 as shown in FIG. 28, the lights-out state of the automotive headlight 560 is kept up as shown in FIG. 28A.

Subsequently, for example, although a result of the measurement of the visible light by the illuminance sensor 552 becomes not more than the threshold value when traveling on shady areas 700 for a comparatively short distance (e.g., under an elevated bridge 600) as shown in FIG. 28B, since the ultraviolet light reflected from the road surface etc. is incident, a result of the measurement of the UV sensor 551 becomes not less than the threshold value, and the lights-out state of the automotive headlight 560 is kept up as shown in FIG. 28A.

Accordingly, since the headlight 560 is unnecessary when traveling on the shady area for the comparatively short distance, a lights-out state can be kept up in accordance with a sense of a driver, and therefore safety and convenience can be improved.

Since a result of the measurement of the visible light by the illuminance sensor 552 and a result of a measurement by the UV sensor 551 becomes not less than the threshold value after passing under the elevated bridge 600 etc., the headlight 560 of the automobile is shifted to the lights-out state again as shown in FIG. 28C.

FIG. 29 is an explanatory diagram showing an operation situation in the case of mounting the auto lighting device 550 according to the third embodiment in automotive to be functioned as only the illuminance sensor 552 under cloudy weather or rainy weather.

Generally, in under cloudy weather or rainy weather, light scattering (Mie scattering) due to clouds occurs.

In the Mie scattering, since scattering intensity is in inverse proportion to the wavelength, it is easy to be affected from the influence of the clouds 900 as short wavelength.

Under such a situation, since a result of the measurement of the visible light by the illuminance sensor 552 becomes not less than the threshold value when traveling in a condition that only the illuminance sensor 552 is functioned as shown in FIG. 29 on a comparatively bright area, the lights-out state of the automotive headlight 560 is kept up.

However, even under such a comparatively bright situation, there is a case where the headlight 560 should be turned ON automatically in order to improve the visibility of a driver. Under such a situation, since the naked eye of a driver become familiar with darkness gradually, the driver may forget lighting of the headlight 560 by manual operation.

Figure 30:
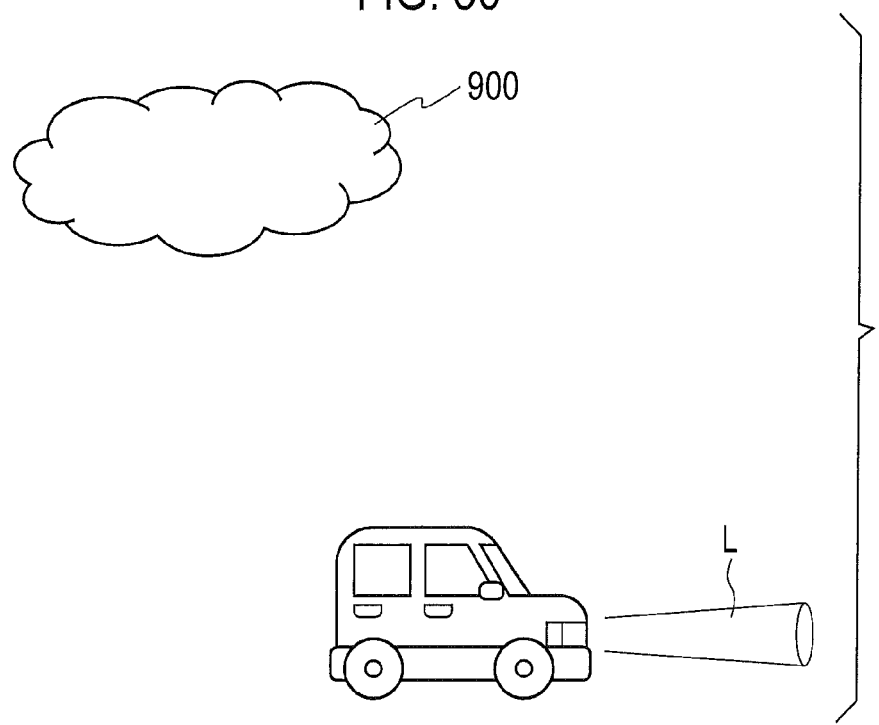
FIG. 30 is an explanatory diagram showing an operation situation in the case of mounting the auto lighting device according to the third embodiment in automobile to be functioned as the illuminance sensor and the UV sensor under cloudy weather or rainy weather.

FIG. 30 is an explanatory diagram showing an operation situation in the case of mounting the auto lighting device 550 according to the third embodiment in automotive to be functioned as the illuminance sensor 552 and the UV sensor 551 under cloudy weather or rainy weather.

Although a result of the measurement of the visible light by the illuminance sensor 552 becomes not less than the threshold value when traveling in the condition that both the illuminance sensor 552 and the UV sensor 551 are functioned on a comparatively bright area under cloudy weather or rainy weather as shown in FIG. 30, a result of the measurement of the ultraviolet light by the UV sensor 551 may become not more than the threshold value due to an influence of the Mie scattering by clouds.

Such a state corresponds to the above-mentioned process of the step S10→step S13→step S14→step S15 in the flow chart of FIG. 26, and therefore the headlight 560 is turned ON automatically.

Accordingly, when visibility is reduced under cloudy weather or rainy weather, the headlight 560 is turned ON automatically without an operating by a driver, and therefore safety and convenience can be improved.

(Scattering of Ultraviolet Light)

Figure 31:
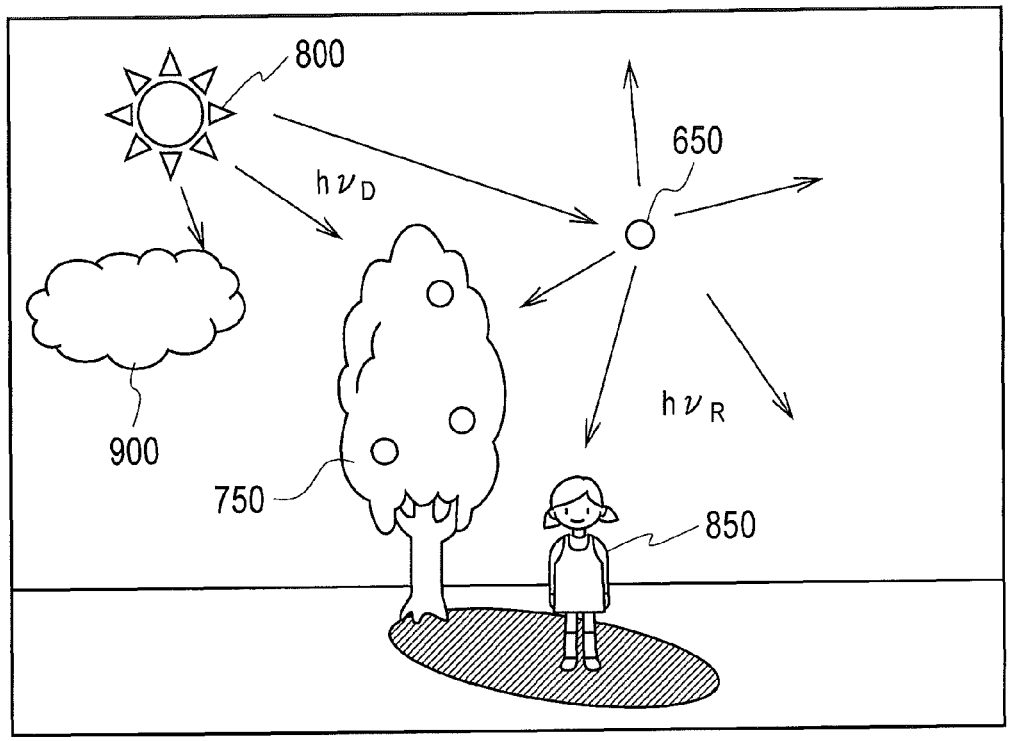
FIG. 31 is an explanatory diagram showing a scattering state of sunlight.

There are direct light $hv_D$ and scattered light among lights which reach the ground from the sun 800 as shown in FIG. 31.

The direct light $hv_D$ is a light which reaches the ground directly from the sun 800. The scattered light $hv_R$ is a light which reaches the ground where the plant 750 and human 850 etc. exist, while the light from the sun 800 touches air molecules (e.g., nitrogen, oxygen, etc.) and aerosol particles 650 (particulates of a solid or a fluid) and changes a direction of movement.

As shown in FIG. 31, the scattered light $hv_R$ is scattered in all directions with the molecule or particles. When lights are scattered with air molecules, there is a property easily scattered as the wavelength of light becomes short, and therefore the ultraviolet light is scattered more easily than the visible light since the wavelength of the ultraviolet light is shorter than that of the visible light.

Figure 32:
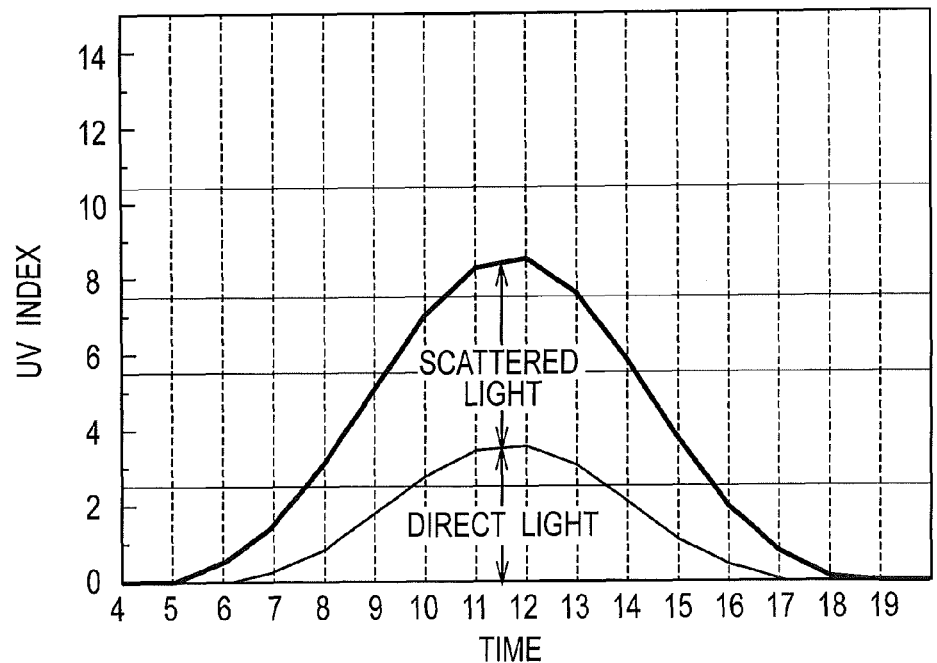
FIG. 32 shows a graphic chart showing a daily variation of the UV index at the time of the fine weather of summer at around the Mainland of Japan in distinction from direct light and scattered light.

FIG. 32 shows a graphic chart showing a daily variation of the UV index at the time of the fine weather of summer at around the Mainland of Japan in distinction from direct light and scattered light.

In FIG. 32, a thick line indicates a total amount of the ultraviolet light which reaches the ground, and a narrow line indicates a total amount of only direct light among the ultraviolet light which reaches the ground.

Contribution of scattered light is larger than that of the direct light in the ultraviolet light which reaches the ground, as clearly from FIG. 32. Therefore, even if sunlight is shielded with a parasol or a hat or by moving to a shady area, since excessive doses of the ultraviolet light are received more than doses recognized visually, caution should be taken in a place in which the sky is in sight.

(Ultraviolet Light Reflected on Ground Surface)

Figure 33:
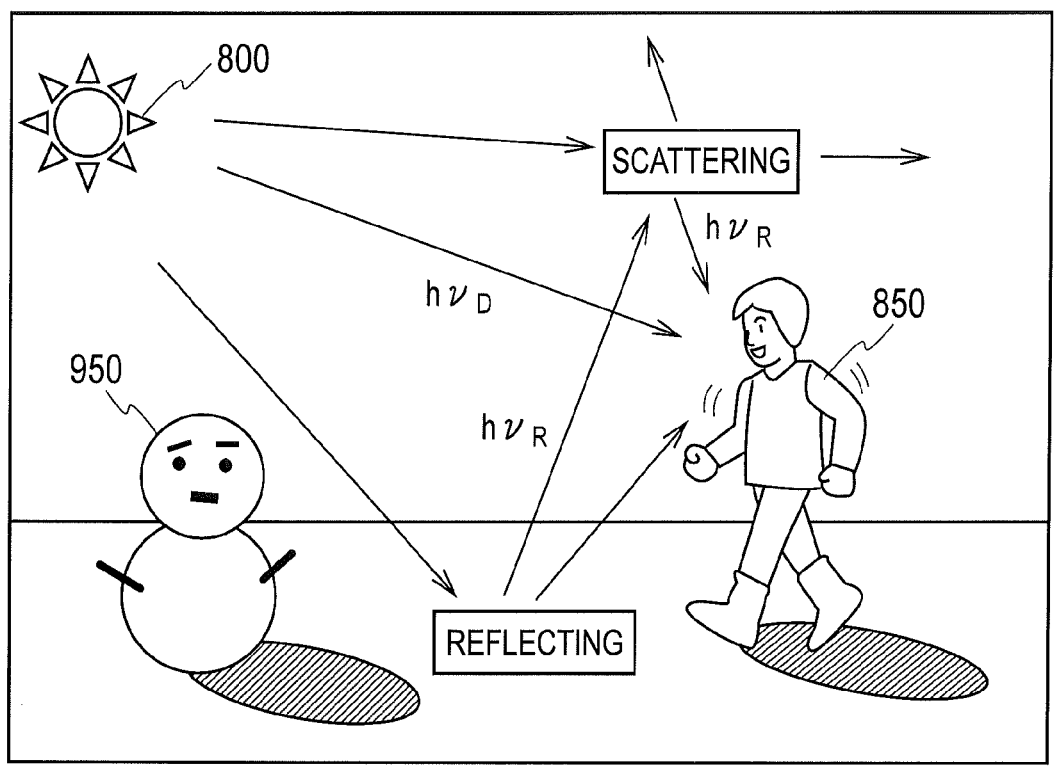
FIG. 33 is an explanatory diagram showing a reflection state from a ground surface of ultraviolet light.

As shown in FIG. 33, ultraviolet light includes ultraviolet light $hv_R$ reflected on the ground surface other than the ultraviolet light $hv_D$ which arrives directly from the sun 800 and the ultraviolet light which arrives by being scattered with air molecules or aerosol particles.

A person 850 who stays in outdoors are not only exposed to the ultraviolet light from the sky toward the ground (including direct light from the sun 800 and light scattered with the atmosphere), but is exposed to the ultraviolet light $hv_R$ reflected on the ground surface.

The UV index indicates an intensity of only the ultraviolet light from the sky toward the ground.

When using the UV index, it is necessary to take into consideration that an effect that ultraviolet light is reflected on the ground surface is also included in an amount of dosage of the ultraviolet light irradiation to be actually exposed.

Note that a ratio reflecting of the ultraviolet light on the ground surface is greatly different with states of the ground surface. For example, although the reflection factor on a grassland or an asphalt pavement is 10% or below, the reflection factor reaches 25% in a sandy beach, and reaches also 80% in a fresh snow-covered ground.

Furthermore, apart of the ultraviolet light $hv_R$ reflected on the ground surface travels toward the sky, and the ultraviolet light is scattered with the atmosphere etc., again and then travels toward the ground. That is, in a place where the reflection factor of the ground surface is large, the scattered light also is stronger than the point where the reflection factor is small.

For example, it has been proved that an amount of dosage of the ultraviolet light irradiation (UV index) from the sky is increased approximately 40 to 50 percent due to the effect of reflecting and scattering in the case of a snow-covered area, as compared with an amount of dosage of the ultraviolet light irradiation in the case of an area without snow.

Although utilization of a hat or a parasol is available in the ultraviolet light $hv_D$ from the sky, it is important to take comprehensive UV protection also against the ultraviolet light $hv_R$ reflected from the ground surface.

According to the photodetecting device (UV sensor) according to the present invention, since the photodetecting device can be mounted in portable devices (e.g., a cellular phone, a wrist watch, etc.), it can avoid receiving excessive doses of the ultraviolet light etc. by always carrying the photodetecting device to measure the environmental UV index in simply.

Other Embodiments

While the present invention is described in accordance with the aforementioned embodiment and its modified example, it should be understood that the description and drawings that configure part of this disclosure are not intended to limit the present invention. This disclosure makes clear a variety of alternative embodiments, working examples, and operational techniques for those skilled in the art.

Such being the case, the present invention covers a variety of embodiments, whether described or not.

INDUSTRIAL APPLICABILITY

The photodetecting element and the photodetecting device according to the present invention are applicable to ultraviolet sensors of UV-A, UV-B, etc. The photodetecting element and the photodetecting device can be mounted in portable devices (e.g., a cellular phone, a wrist watch, etc.), and therefore can be applied to a simply measuring device of the UV index. Moreover, the auto lighting device according to the present invention is applicable to lighting systems of vehicles (e.g., an automobile, a bicycle, etc.), streetlights, etc.

What is claimed is:

1. A photodetecting element comprising:
   an optically transparent substrate;
   an optical absorption layer configured to absorb light and formed on the optically transparent substrate, the optical absorption layer comprising a first surface and a second surface, the first surface facing the optically transparent substrate, the second surface being opposite to the first surface;
   a detecting electrode formed on the optically transparent substrate; and
   an insulating film formed so that at least the second surface of the optical absorption layer is covered, wherein
   the light is radiated from a back side surface of the optically transparent substrate, and the detecting electrode detects a current generated from the optical absorption layer.

2. The photodetecting element according to claim 1, wherein
   the detecting electrode is composed of a pair of electrodes, and each of the electrodes is formed to be comb-shaped so that teeth of a comb are mutually engaged at predetermined spacing.

3. The photodetecting element according to claim 1 further comprising:
   an optical filter formed on the back side surface of the optically transparent substrate, and configured to absorb a portion of the light of a specified wavelength range.

4. The photodetecting element according to claim 3 further comprising:
   an insulating film formed on a side surface of the optically transparent substrate, and configured to absorb light of the same wavelength range as that of the portion of the light absorbed by the optical filter.

5. The photodetecting element according to claim 1 further comprising:
   a package formed to surround a side surface of the optically transparent substrate to reach at least a height of the back side surface of the optically transparent substrate; and
   an adhesive layer, wherein
   the optically transparent substrate and the package are bonded with the adhesive layer.

6. The photodetecting element according to claim 1, wherein
   the optical absorption layer detects the light by photoelectric conversion of the light.

7. The photodetecting element according to claim 3, wherein
   the optical filter is an optical filter formed by hardening a pasty substance, and semiconductor particles for absorbing the portion of the light of the specified wavelength range is included in the pasty substance.

8. The photodetecting element according to claim 7, wherein
   the semiconductor particles are particles from the group consisting of a semiconductor of group IV element, a compound semiconductor of group II element and group VI element, a compound semiconductor of group III element and group V element, and a compound semiconductor of group III element and group VI element.

9. The photodetecting element according to claim 7, wherein
a principal constituent of the pasty substance is one or more substances from the group consisting of a glass based material, an acrylic resin, a silicone resin, and an amorphous fluorine contained resin.

10. The photodetecting element according to claim 9, wherein
the pasty substance is composed of a paste to which the glass based material and the semiconductor particles are mixed.

11. A photodetecting device comprising a plurality of photodetecting elements, each the photodetecting elements comprising:
an optically transparent substrate;
an optical absorption layer configured to absorb light formed on the optically transparent substrate;
a detecting electrode formed on the optically transparent substrate; and
an insulating film formed so that a surface of the optical absorption layer is covered, wherein
at least a part of the detecting electrode is embedded in the optical absorption layer, the light is radiated from a back side surface of the optically transparent substrate, and the detecting electrode detects a current generated from the optical absorption layer, wherein
the plurality of the photodetecting element comprises a first photodetecting element and a second photodetecting element, wherein
the first photodetecting element comprises a first optical filter formed on a surface of light incidence side on the first optically transparent substrate, the first optical filter configured to absorb light of a certain wavelength range $\lambda$,
the second photodetecting element comprises a second optical filter formed on a surface of light incidence side on the second optically transparent substrate, the second optical filter configured to absorb light of a wavelength range $\lambda 1$ including the wavelength range $\lambda$ or having no optical absorption range in the wavelength range $\lambda 1$, and
an amount of the light of the wavelength range $\lambda$ is measured by calculating a signal from the first photodetecting element and a signal from the second photodetecting element.

12. The photodetecting device according to claim 11, wherein for each of the respective photodetecting elements,
the detecting electrode is composed a pair of electrodes, and each of the electrodes is formed to be comb-shaped so that teeth of a comb are mutually engaged at predetermined spacing.

13. The photodetecting device according to claim 11, wherein
when irradiating the photodetecting device with sunlight, a light-detecting sensitivity spectrum indicating a correlative relationship between a light-detecting sensitivity and a wavelength is approximated with CIE operational spectrum of UV-B.

14. The photodetecting device according to claim 13, wherein
the first optical filter and the second optical filter are respectively mixtures with a pasty material having no optical absorption range in the wavelength range $\lambda$, and a powder of a semiconductor different in an absorption end.

15. The photodetecting device according to claim 11 further comprising:
a third optical filter of the same characteristics as that of the first optical filter; and
a third photodetecting element having a photoelectric conversion region, a width of the photoelectric conversion region different from that of the first photodetecting element, wherein
an amount of the light of the wavelength range $\lambda$ is calculated by the first photodetecting element, the second photodetecting element, and the third photodetecting element.

16. The photodetecting device according to claim 15 further comprising:
a first calculating unit configured to calculate a photo detection signal J0 per unit area of an light-detecting area except for the wavelength range $\lambda$ detected by the first photodetecting element and the third photodetecting element; and
a second calculating unit configured to calculate an amount of the light of the wavelength range $\lambda$ by calculating a difference between A×J0 (where A is an light-detecting area of the second photodetecting element) and a photo detection signal of the second photodetecting element.

17. The photodetecting element according to claim 1, wherein
the optical absorption layer further comprises a third surface connecting between the first surface and the second surface, and
the insulating film is extended from the second surface so as to cover the third surface.

18. The photodectecting element according to claim 17, further comprising an adhesive layer, and wherein
the optically transparent substrate is formed beyond a formation region of the optical absorption layer in a planar view, and
the optically transparent substrate and the insulating film covering the third surface are adhhered to each other with the adhesive layer.

19. The photodetecting element according to claim 1, wherein
the detecting electrode is formed of a pair of electrodes, and
each of the pair of electrodes is formed at a side of the optically transparent substrate to be on the optical absorption layer.

20. The photodectecting element according to claim 1, wherein
at least a part of the detecting electrode is embedded in the optical absorption layer.

* * * * *